United States Patent
Dote

(10) Patent No.: US 9,596,767 B2
(45) Date of Patent: Mar. 14, 2017

(54) ELECTRONIC COMPONENT, METHOD OF MANUFACTURING ELECTRONIC COMPONENT, AND ELECTRONIC DEVICE

(71) Applicant: FUJITSU LIMITED, Kawasaki-shi, Kanagawa (JP)

(72) Inventor: Aki Dote, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/725,235

(22) Filed: May 29, 2015

(65) Prior Publication Data

US 2015/0373850 A1 Dec. 24, 2015

(30) Foreign Application Priority Data

Jun. 24, 2014 (JP) .................. 2014-129060

(51) Int. Cl.
| | | |
|---|---|---|
| *H01L 21/02* | (2006.01) | |
| *H05K 3/28* | (2006.01) | |
| *H05K 1/11* | (2006.01) | |
| *H05K 3/34* | (2006.01) | |
| *H05K 3/40* | (2006.01) | |

(52) U.S. Cl.
CPC .... *H05K 3/282* (2013.01); *H01L 2224/16145* (2013.01); *H05K 1/111* (2013.01); *H05K 3/3436* (2013.01); *H05K 3/4007* (2013.01); *H05K 2201/09272* (2013.01); *H05K 2201/09381* (2013.01); *H05K 2201/09727* (2013.01); *H05K 2201/10515* (2013.01); *H05K 2203/0597* (2013.01); *Y10T 29/49163* (2015.01)

(58) Field of Classification Search
CPC ....... H01L 21/02; H01L 21/84; H01L 21/336; H01L 21/768; H01L 21/8242; H01L 27/092; H01L 29/78
USPC .......................................... 257/390
See application file for complete search history.

(56) References Cited

U.S. PATENT DOCUMENTS

| | | | | |
|---|---|---|---|---|
| 4,735,919 A | * | 4/1988 | Faraone ............ | H01L 21/28273 257/316 |
| 5,017,505 A | * | 5/1991 | Fujii ................. | H01L 29/7883 257/E29.304 |
| 5,087,583 A | * | 2/1992 | Hazani .............. | G11C 11/5621 257/E27.103 |
| 5,652,465 A | * | 7/1997 | Hosoda ............. | H01L 21/7682 257/758 |
| 5,663,090 A | * | 9/1997 | Dennison ........... | H01L 28/84 257/E21.013 |

(Continued)

FOREIGN PATENT DOCUMENTS

| | | |
|---|---|---|
| JP | H05-226339 | 9/1993 |
| JP | H06-349886 | 12/1994 |

(Continued)

*Primary Examiner* — Michael Lebentritt
(74) *Attorney, Agent, or Firm* — Kratz, Quintos & Hanson, LLP

(57) ABSTRACT

An electronic component includes: a substrate; wiring provided on the substrate, and including an uneven section at an edge portion of the wiring in plain view; and an insulating film provided on the substrate and on the wiring.
And a method of manufacturing an electronic component includes: forming, on a substrate, wiring including an uneven section at an edge portion of the wiring in plain view; and forming an insulating film on the substrate and on the wiring.

8 Claims, 25 Drawing Sheets

(56) References Cited

U.S. PATENT DOCUMENTS

| | | | | |
|---|---|---|---|---|
| 5,845,812 | A * | 12/1998 | Morrison | B05B 7/2408 222/107 |
| 6,037,233 | A * | 3/2000 | Liu | H01L 21/28105 257/E21.196 |
| 6,037,712 | A * | 3/2000 | Codama | H01L 27/3237 313/292 |
| 6,114,229 | A * | 9/2000 | Hause | H01L 21/28035 257/E21.197 |
| 8,166,643 | B2 * | 5/2012 | Shibata | H05K 3/44 216/13 |
| 2002/0105037 | A1 * | 8/2002 | Takahashi | H01L 29/792 257/390 |
| 2002/0173096 | A1 * | 11/2002 | Okudaira | H01L 21/76885 438/253 |
| 2003/0151849 | A1 * | 8/2003 | Sasaki | G11B 5/17 360/123.28 |
| 2004/0145858 | A1 * | 7/2004 | Sakurada | H05K 3/4647 361/600 |
| 2004/0172819 | A1 | 9/2004 | Karasawa | |
| 2006/0166411 | A1 * | 7/2006 | Morisue | H01L 27/14621 438/149 |
| 2007/0037352 | A1 * | 2/2007 | Suzawa | H01L 27/3258 438/282 |
| 2010/0289085 | A1 * | 11/2010 | Yuan | H01L 21/28114 257/369 |
| 2012/0211269 | A1 | 8/2012 | Saitou | |
| 2016/0005670 | A1 * | 1/2016 | Iizuka | H01L 23/4006 257/693 |

FOREIGN PATENT DOCUMENTS

| | | |
|---|---|---|
| JP | H07-221401 | 8/1995 |
| JP | 2001-332554 A1 | 11/2001 |
| JP | 2004-221404 A1 | 8/2004 |
| JP | 2009-64942 A1 | 3/2009 |
| JP | 2009-177072 A1 | 8/2009 |
| WO | 2011/052744 A1 | 5/2011 |

* cited by examiner

ELECTRONIC COMPONENT, METHOD OF MANUFACTURING ELECTRONIC COMPONENT, AND ELECTRONIC DEVICE

CROSS-REFERENCE TO RELATED APPLICATION

This application is based upon and claims the benefit of priority of the prior Japanese Patent Application No. 2014-129060, filed on Jun. 24, 2014, the entire contents of which are incorporated herein by reference.

FIELD

The embodiments discussed herein are related to an electronic component, a method of manufacturing an electronic component, and an electronic device.

BACKGROUND

In the field of electronic components, there have been known techniques of applying a coating of an insulating film to a substrate on which a conductor layer is formed. For example, in a known technique for a semiconductor device, a substrate on which an electrode pad is formed is coated with an insulating film (a protective film, or a passivation film) provided with an opening portion communicating with the electrode pad.

On a substrate of an electronic component, wiring may be formed as a conductor layer. In the case of coating such a substrate with an insulating film, the wiring may form a step on the substrate, and the step may result in such poor coat ability of the insulating film that an edge portion of the wiring may be exposed through the insulating film. In this case, a protecting effect produced by the insulating film may be reduced, which may lead to a decline in the reliability of the electronic component.

The following is a reference document.
[Document 1] Japanese Laid-open Patent Publication No. 06-349886.

SUMMARY

According to an aspect of the invention, an electronic component includes: a substrate; wiring provided on the substrate, and including an uneven section at an edge portion of the wiring in plain view; and an insulating film provided on the substrate and on the wiring.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1A:
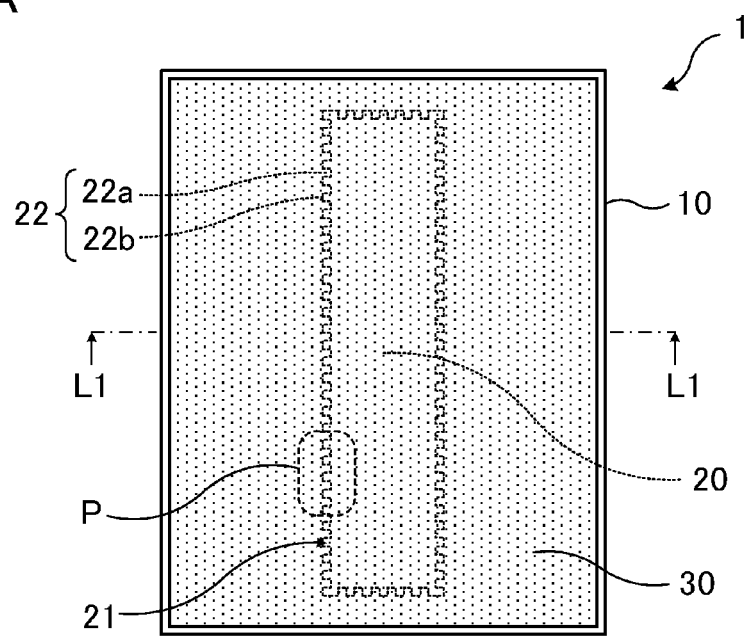
FIGS. 1A to 1C are diagrams illustrating an example of an electronic component.
Figure 1B:
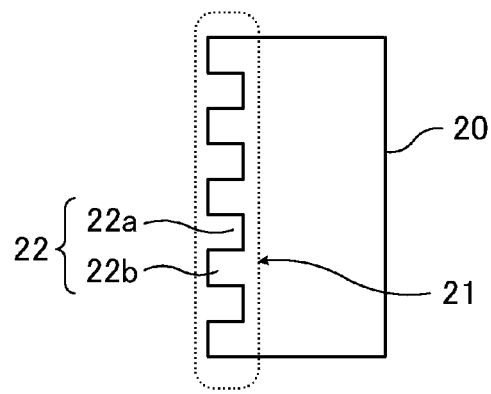
Figure 1C:
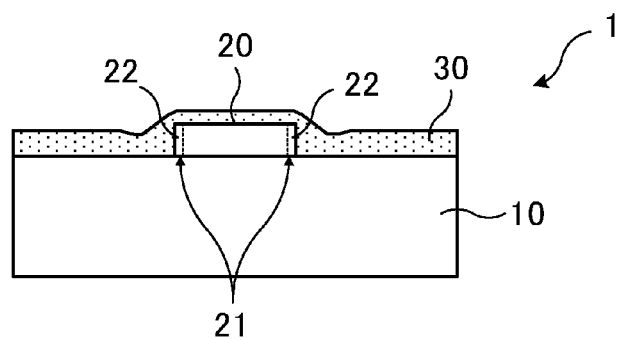

FIGS. 1A to 1C are diagrams illustrating an example of an electronic component. Here, FIG. 1A is a main-part plane schematic diagram of an electronic component of this example, FIG. 1B is an enlarged schematic diagram of a part P in FIG. 1A, and FIG. 1C is a schematic diagram of a section taken along a line L1-L1 in FIG. 1A. FIG. 1B illustrates only a part of wiring of the electronic component.

An electronic component 1 is, for example, a semiconductor element (a semiconductor chip) such as a large scale integration (LSI) circuit and a memory, a circuit board such as a printed board and an interposer, a silicon (Si) interposer, a pseudo-system on chip (SoC) having a semiconductor element embedded in a resin layer, or the like. Configuration examples of the electronic component 1 will be described later (FIGS. 19 to 22). The electronic component 1 includes a substrate 10 as a main body of a semiconductor element, a circuit board, or the like. The electronic component 1 further includes wiring 20 provided on the substrate 10, and an insulating film 30 provided on the substrate 10 and on the wiring 20.

Here, a single linear wire is taken as an example of the wiring 20 on the substrate 10, as illustrated in FIG. 1A. Various kinds of conductive material may be used for the wiring 20. Examples of the conductive material used for the wiring 20 include copper (Cu), aluminum (Al), and a material containing Cu or Al. The wiring 20 may contain elements such as silver (Ag), gold (Au), nickel (Ni), and titanium (Ti).

As illustrated in FIGS. 1A to 1C, the wiring 20 has an uneven section 22 (a depression 22a and a projection 22b) at an edge portion 21 in plain view. For example, multiple uneven sections 22 are provided continuously at the entire edge portion 21 of the wiring 20. Here, the depression 22a and the projection 22b each having a rectangular planar shape and both having the same size are illustrated as an example, but the form of the uneven section 22 is not limited thereto. A method of forming the uneven section 22 of the wiring 20 will be described later.

The insulating film 30 functions as a protective film (a passivation film) that protects the substrate 10 and the wiring 20. A photosensitive organic insulating material may be used for the insulating film 30. Examples of the insulating material used for the insulating film 30 include a resin containing a substance such as polybenzoxazole (PBO) and polyimide (PI). In addition, various kinds of resins used for solder resists in the field of electronic components such as semiconductor elements and circuit boards may be used as the insulating material for the insulating film 30.

FIG. 1A illustrates the insulating film 30 having a size smaller than the substrate 10 for convenience, but the insulating film 30 may be provided to cover the entire surface (a surface where the wiring 20 is disposed) of the substrate 10.

The insulating film 30 composed of the resin as described above is formed as follows, for example. First, a fluid resin is applied onto the substrate 10 by spin coating, spray coating, screen printing, or the like. Next, the applied resin is dried (prebaked) at a predetermined temperature. The dried resin is then exposed to light and developed to form an opening portion in a region to become a connection section (a terminal or a part of the terminal) for connection to another component. The resin after development is then cured by a technique such as heating and ultraviolet irradiation.

When the insulating film 30 is thus formed, a reduction in the thickness (thickness reduction) of the resin from a level at the time of the application may occur during drying and development, or further during curing. In other words, a thickness reduction of the resin film may occur due to solvent volatilization during drying, dissolution during development, volume shrinkage during curing, and the like.

In the electronic component 1 configured as described above, the uneven section 22 is provided at the edge portion 21 of the wiring 20. Therefore, exposure of the edge portion 21 of the wiring 20 through the insulating film 30 may be effectively suppressed, even when the thickness reduction of the resin film occurs at the time of formation of the insulating film 30.

Here, a case of wiring not having the uneven section 22 will be described for a comparison.

Figure 2A:
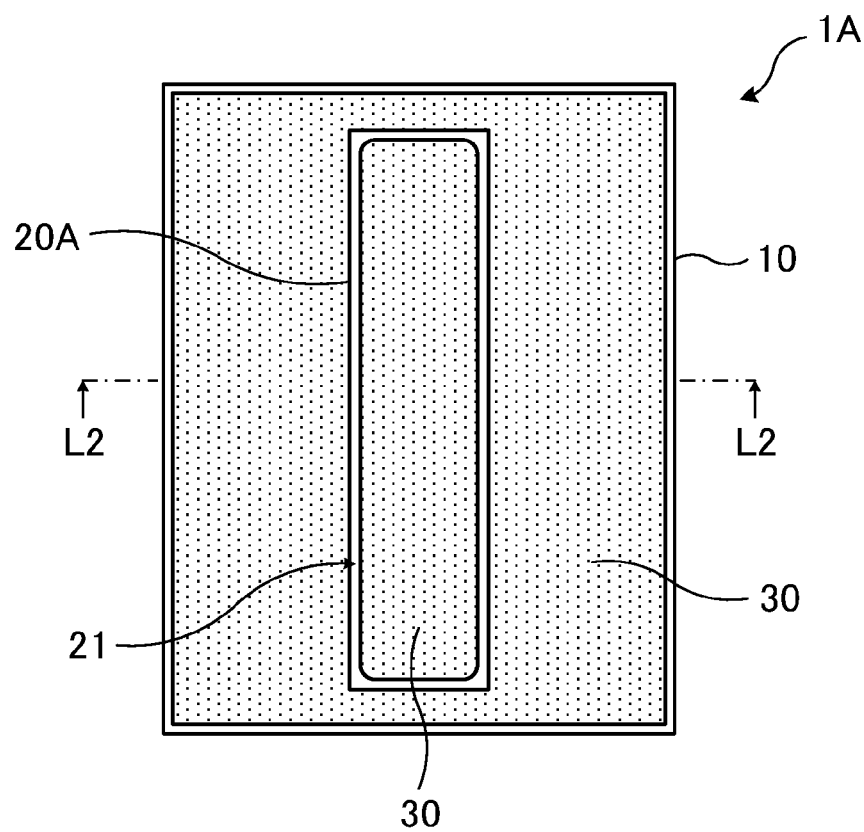
FIGS. 2A and 2B are diagrams illustrating an example of an electronic component according to another form.
Figure 2B:
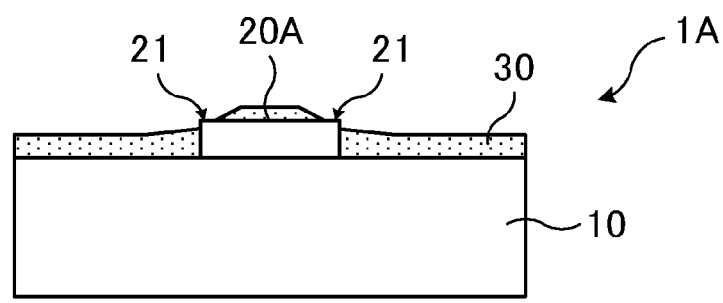

FIGS. 2A and 2B are diagrams illustrating an example of an electronic component according to another form. Here, FIG. 2A is a main-part plane schematic diagram of the electronic component according to this form, and FIG. 2B is a schematic diagram of a section taken along a line L2-L2 in FIG. 2A.

An electronic component 1A illustrated in FIGS. 2A and 2B includes the substrate 10, wiring 20A provided on the substrate 10, and the insulating film 30 provided on the substrate 10 and on the wiring 20A. The wiring 20A of the electronic component 1A is different from the wiring 20 of the electronic component 1 described above, in that the wiring 20A is not provided with an uneven section at the edge portion 21 thereof.

In the electronic component 1A having the wiring 20A described above, when the insulating film 30 is formed on the substrate 10 and on the wiring 20A in the above-described procedure, the edge portion 21 of the wiring 20A may be exposed through the insulating film 30 due to thickness reduction at the time of drying, development, and curing, as illustrated in FIGS. 2A and 2B. In other words, the wiring 20A becomes a step on the substrate 10, thereby reducing the thickness of the resin at the edge portion 21 of the wiring 20A, and further, the thickness reduction occurs during drying, development, and curing. Therefore, the edge portion 21 of the wiring 20A is exposed through the insulating film 30.

FIG. 2A illustrates a state where the edge portion 21 along the entire perimeter of the wiring 20A is exposed through the insulating film 30, for convenience. However, there may be such a case where the edge portion 21 along the entire perimeter is partially exposed through the insulating film 30.

When the edge portion 21 of the wiring 20A is exposed through the insulating film 30, element diffusion of the wiring 20A may occur at the exposed edge portion 21. A part such as a bump that is formed of a conductive material and is used for connection to another component may come into contact with the exposed edge portion 21. The element diffusion at the edge portion 21 and the contact of the conductive material with the edge portion 21 described above may cause a short in a circuit in the electronic component 1A.

Further, when the edge portion 21 of the wiring 20A is exposed through the insulating film 30, deterioration due to corrosion and the like of the exposed edge portion 21, and deterioration of the wiring 20A starting from the edge portion 21 may easily occur. Furthermore, a region where the insulating film 30 is not formed may become an entry path for moisture and the like, which may reduce moisture resistance of the electronic component 1A. These phenomena may reduce the reliability of the electronic component 1A.

If the resin applied first is made to be thick so as to form the insulating film 30 having a larger thickness, the exposure of the edge portion 21 of the wiring 20A through the insulating film 30 as described above may be avoided. However, if the insulating film 30 is made thick, the thickness of the electronic component 1A increases, and moreover, an opening portion formed in a terminal area of the insulating film 30 deepens, so that it may take a longer time to form the opening portion, and it may become more difficult to connect another component (such as a bump) to the opening portion (a terminal). Moreover, if the insulating film 30 is made to be thick, relatively large stress might be applied to the substrate 10 at the time of forming the insulating film 30 (such as at the time of curing in which volume shrinkage of the resin occurs), and warpage of the substrate 10 might occur due to this stress. Such warpage of the substrate 10 appears clearly, when the thickness of the substrate 10 becomes small.

In contrast, in the electronic component 1 configured as illustrated in FIGS. 1A to 1C, the uneven section 22 is provided at the edge portion 21 of the wiring 20, and exposure of the edge portion 21 of the wiring 20 through the insulating film 30 is effectively suppressed due to the presence of the uneven section 22.

In other words, when the wiring 20 is provided with the uneven section 22, the surface area of the edge portion 21 increases, as compared with the case where such an uneven section is not provided. As a result, an increase occurs in the contact area between the resin applied when forming the insulating film 30 on the substrate 10 as well as on the wiring 20, and the edge portion 21 of the wiring 20, so that a larger surface tension acts on the resin.

Due to such action of larger surface tension, the resin is drawn toward the edge portion 21 provided with the uneven section 22 in the wiring 20 (an outward flow from the edge portion 21 is suppressed), during application of the resin, and then during subsequent drying. Therefore, even if a certain amount of thickness reduction occurs in the resin during drying, the thickness reduction of the resin at the edge portion 21 of the wiring 20 may be suppressed, and the edge portion 21 will not be exposed at that time or during subsequent development and curing.

In forming the insulating film 30, the light exposure, development, and curing of the resin are performed after the application and drying of the resin. Of these, for example, during development and curing, a certain amount of thickness reduction may occur in the resin. Even if such thickness reduction of the resin occurs, exposure of the edge portion 21 through the insulating film 30 may be suppressed in the wiring 20 provided with the uneven section 22, as illustrated in FIGS. 1A and 1C, because the resin at the edge portion 21 is relatively thick, as compared with the case where such an uneven section is not provided.

In the electronic component 1 in which exposure of the edge portion 21 of the wiring 20 through the insulating film 30 is thus suppressed, occurrences of a short and corrosion in the wiring 20 may be suppressed, and a decrease in the moisture resistance of the electronic component 1 may be suppressed. Therefore, the electronic component 1 in which deterioration of the reliability is suppressed may be implemented.

Furthermore, according to the electronic component 1 described above, the insulating film 30 (the resin used for the formation thereof) may not be made thick to suppress the exposure of the edge portion 21 of the wiring 20 through the insulating film 30. Therefore, downsizing of the electronic component 1, the efficiency with which the opening portion is formed in the insulating film 30, suppression of warpage of the substrate 10 and the electronic component 1, and the like are achievable.

In the above description, the case where the uneven sections 22 are provided at the edge portion 21 of the linear wiring 20 is taken as an example. However, when a land is connected to the wiring 20, an uneven section may be provided at an edge portion of the land likewise.

Figure 3:
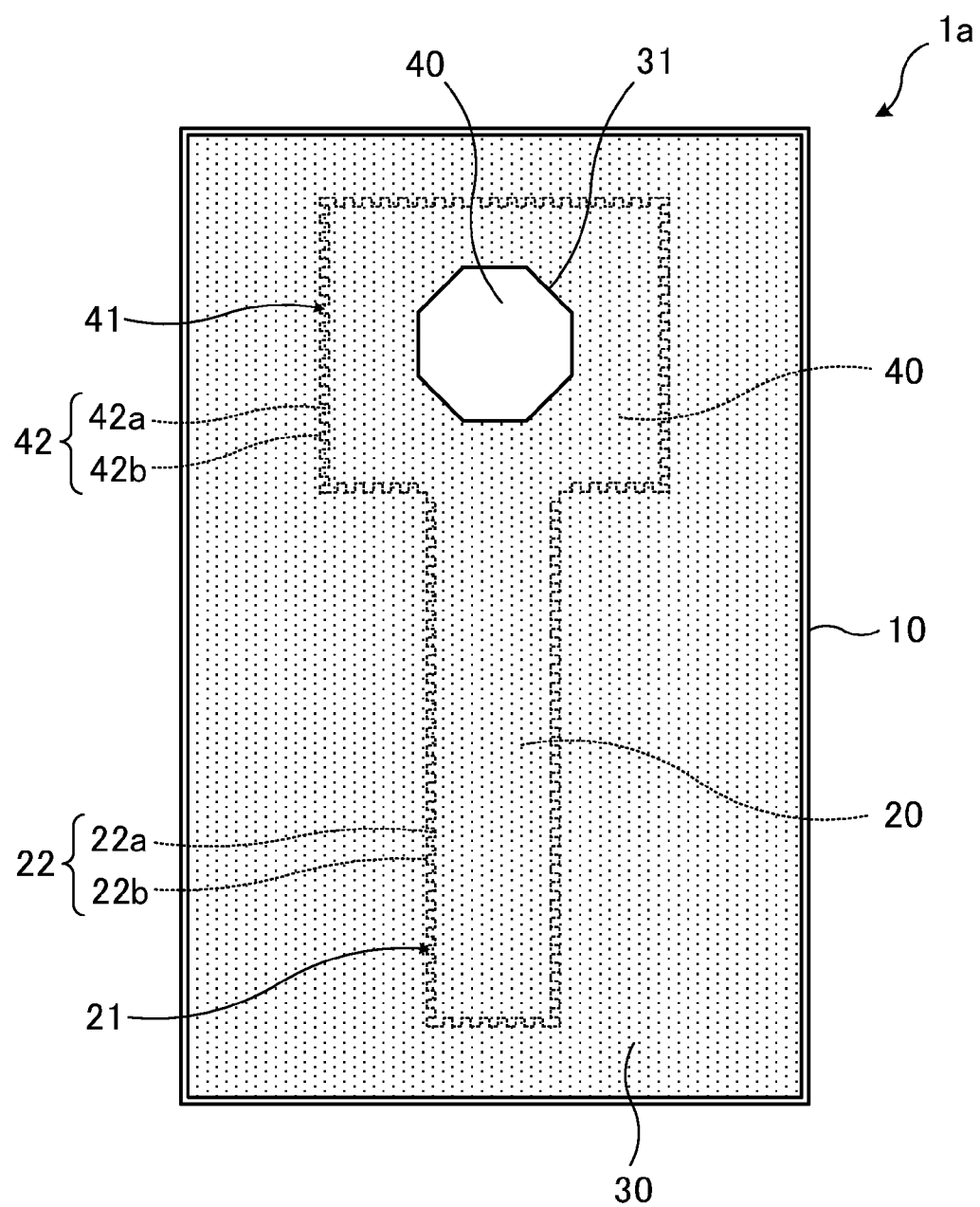
FIG. 3 is a diagram illustrating an electronic component by way of another example.

FIG. 3 is a diagram illustrating an electronic component by way of another example.

Here, FIG. 3 is a main-part plane schematic diagram of the electronic component in this example. An electronic component 1a illustrated in FIG. 3 includes, the substrate 10, the wiring 20 as well as a land 40 provided on the substrate 10, and the insulating film 30 provided on the substrate 10, on the land 40, and on the wiring 20.

The land 40 is provided so as to be continuously in contact with the wiring 20, and has a planar shape and a width larger than the width of the wiring 20. Here, the land 40 in a rectangular planar shape is illustrated as an example, but the planar shape of the land 40 is not limited thereto. The land 40 has an uneven section 42 (a depression 42a and a projection 42b) at an edge portion 41 in plain view. The uneven section 42 of the land 40 may have, for example, the same shape and size as the uneven section 22 of the wiring 20. The uneven section 42 of the land 40 may have a form different from the form of the uneven section 22 of the wiring 20. A method of forming the uneven section 22 of the wiring 20 and the uneven section 42 of the land 40 will be described later.

In the electronic component 1a, the insulating film 30 is provided with an opening portion 31 communicating with the land 40. The insulating film 30 is provided on the substrate 10 and on the wiring 20, as well as on the land 40 except for a region corresponding to the opening portion 31, and functions as a protective film that protects the substrate 10, the wiring 20, and the land 40. In the land 40, the region (a terminal) exposed in the opening portion 31 is used for connection to another component (a bump). The insulating film 30 is formed, for example, by applying a resin for the insulating film 30 onto the substrate 10 provided with the land 40 and the wiring 20, and subsequently subjecting the resin to drying, light exposure, development, and curing in a manner similar to the manner described above. The opening portion 31 communicating with the land 40 is formed by subjecting the resin to the light exposure and development.

In the electronic component is thus configured, the uneven section 42 is provided at the edge portion 41 of the land 40 and thus, a thickness reduction of the resin at the edge portion 41 of the land 40 may be suppressed, as with the wiring 20 having the uneven section 22 provided at the edge portion 21. Therefore, exposure of the edge portion 41 through the insulating film 30 may be suppressed, even if a certain amount of thickness reduction occurs in the resin during forming of the insulating film 30. This allows suppression of occurrences of a short and corrosion in a conductor pattern including the wiring 20 and the land 40, as well as a decrease in the moisture resistance of the electronic component 1a, and therefore the electronic component 1a, in which a decline of reliability is suppressed, to be realized.

Further, the insulating film 30 provided in the electronic component is may not be increased in thickness. Therefore, downsizing of the electronic component 1a, the efficiency with which the opening portion 31 is formed in the insulating film 30, suppression of warpage of the substrate 10 and the electronic component 1a, and the like are achievable.

Next, a method of forming the electronic component provided with the uneven section(s) as described above will be described. Here, the method of forming the electronic component will be described below by taking, as an example, the electronic component is provided with the wiring 20 having the uneven section 22 and the land 40 having the uneven section 42, with reference to FIGS. 4A to 10B.

Figure 4A:
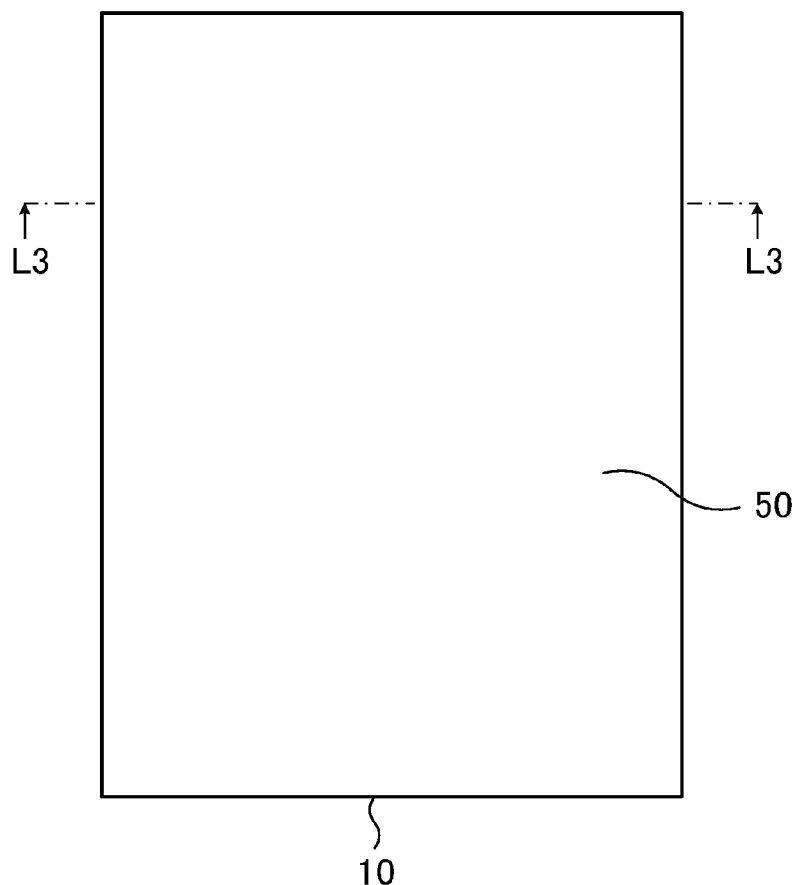
FIGS. 4A and 4B are explanatory diagrams of a process of forming a feeding layer.
Figure 4B:
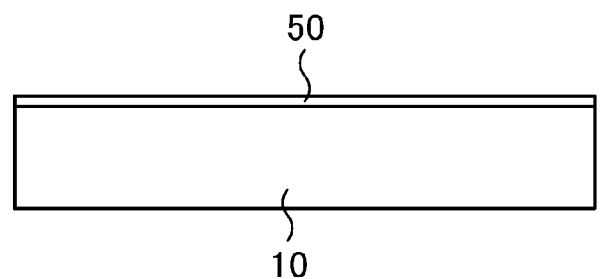

FIGS. 4A and 4B are explanatory diagrams of a process of forming a feeding layer. Here, FIG. 4A is a main-part plane schematic diagram, and FIG. 4B is a schematic diagram of a section taken along a line L3-L3 in FIG. 4A.

First, the substrate 10 on which the wiring 20 and the land 40 are to be formed is prepared. The substrate 10 is a main body of a semiconductor element, a circuit board, an interposer, a pseudo-SoC, or the like.

The main body of the semiconductor element includes a semiconductor substrate provided with an element such as a transistor, and a wiring layer (such as multilayer wiring) including a conductor section (wiring and/or a via) electrically connected to the element such as the transistor. The main body of the circuit board includes a conductor section provided in an insulating section (wiring and/or a via). The main body of the interposer includes a conductor section (wiring and/or a via) provided in an insulating section, or an electrode such as a through-silicon via (TSV) provided in a semiconductor layer such as Si. The main body of the pseudo-SoC includes an electronic component such as a semiconductor element embedded in a resin layer.

Here, the internal structure of each of the main bodies is not illustrated for convenience. Configuration examples of the respective main bodies will be described later (FIGS. 19 to 22).

After the substrate 10 is prepared as a predetermined substrate, a feeding layer 50 for electroplating to be described later is formed on the substrate 10, as illustrated in FIGS. 4A and 4B. For example, by sputtering, a titanium (Ti) film having a film thickness of about 100 nm is formed as an adhesion layer, and subsequently, a Cu film having a film thickness of about 250 nm is formed as a seed layer.

Figure 5A:
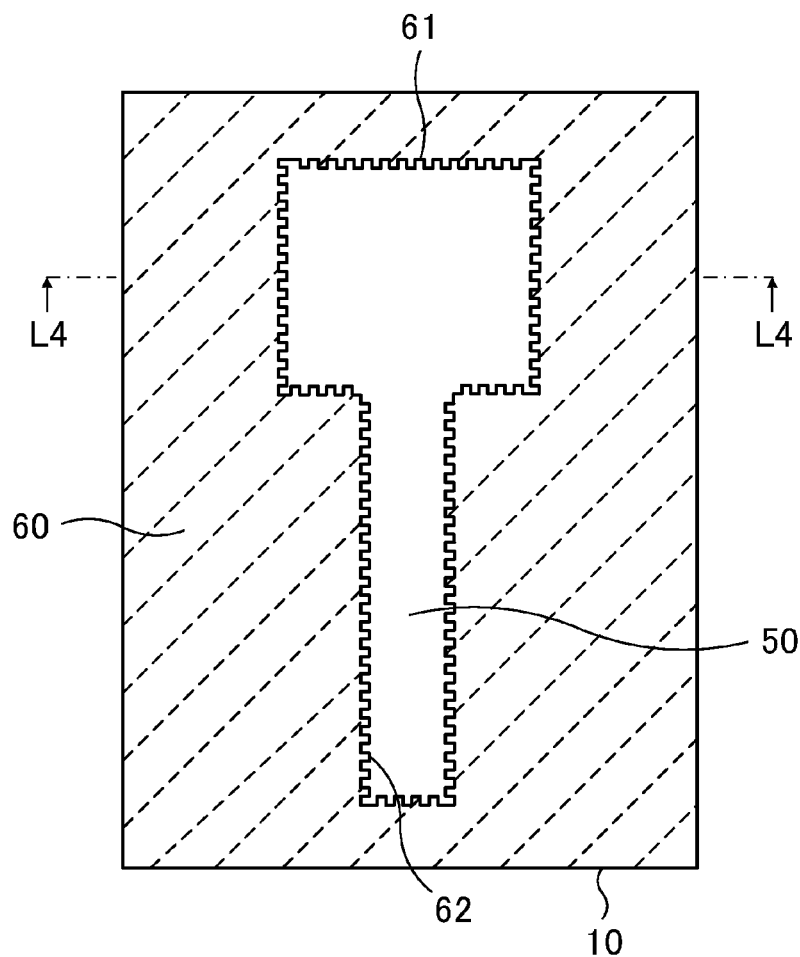
FIGS. 5A and 5B are explanatory diagrams of a process of forming a mask.
Figure 5B:
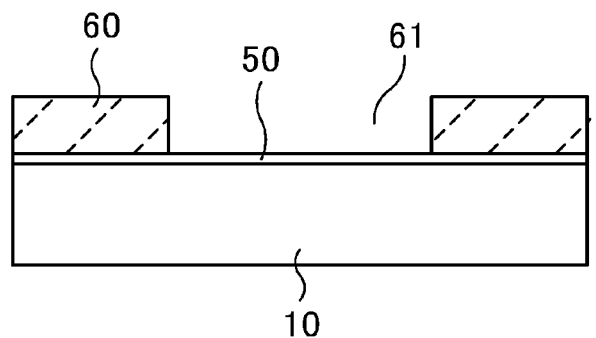

FIGS. 5A and 5B are explanatory diagrams of a process of forming a mask. Here, FIG. 5A is a main-part plane schematic diagram, and FIG. 5B is a schematic diagram of a section taken along a line L4-L4 in FIG. 5A.

After the feeding layer 50 is formed, a mask 60 having an opening portion 61 in a region corresponding to the wiring 20 and the land 40 is formed on the feeding layer 50, as illustrated in FIGS. 5A and 5B.

For example, a resist is used for the mask 60. In forming the mask 60, first, a resist layer is formed on the feeding layer 50 by applying a fluid resist material or affixing a dry film resist. Next, the formed resist layer is exposed to light and developed to form the opening portion 61 corresponding to the wiring 20 having the uneven section 22 and the land 40 having the uneven section 42. The mask 60 after development may have a film thickness of, for example, about 8 μm. In the formation of the electronic component 1a, the opening portion 61 having an uneven section 62 corresponding to the uneven section 22 of the wiring 20 and the uneven section 42 of the land 40 is formed in a stage of forming the mask 60.

Here, the opening portion 61 that is one opening portion corresponding to the wiring 20 and the land 40 is illustrated. However, when there is another wiring on the substrate 10, or another conductor pattern including wiring and a land, an opening portion corresponding thereto is also formed likewise.

Figure 6A:
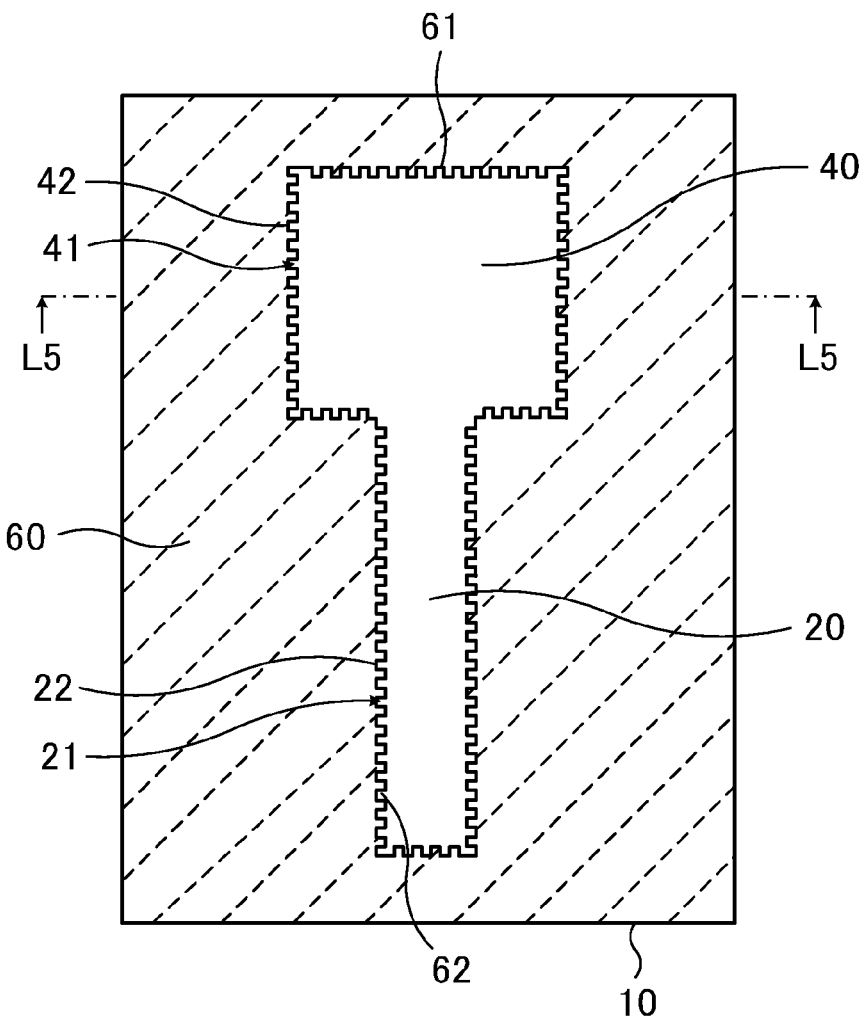
FIGS. 6A and 6B are explanatory diagrams of a process of forming wiring and a land.
Figure 6B:
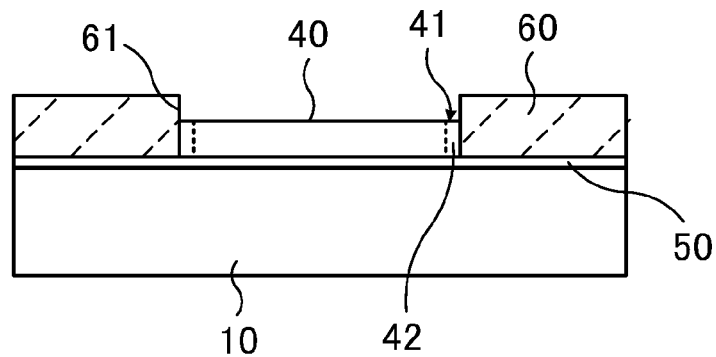

FIGS. 6A and 6B are explanatory diagrams of a process of forming wiring and a land. Here, FIG. 6A is a main-part plane schematic diagram, and FIG. 6B is a schematic diagram of a section taken along a line L5-L5 in FIG. 6A.

After the mask 60 is formed, the wiring 20 and the land 40 are formed in the opening portion 61 of the mask 60, as illustrated in FIGS. 6A and 6B.

The wiring 20 and the land 40 are formed by, for example, electroplating using the feeding layer 50 formed earlier. By performing electroplating, a conductive material such as Cu of the mask 60 is deposited in the opening portion 61. The opening portion 61 of the mask 60 is provided with the uneven section 62, and the wiring 20 having the uneven section 22 and the land 40 having the uneven section 42 are formed by depositing a conductive material such as Cu in this opening portion 61 by performing electroplating. The wiring 20 and the land 40 may each have a film thickness of, for example, about 5 μm.

When an opening portion corresponding to another wiring and land is formed in the mask 60 in addition to the opening portion 61, a conductive material such as Cu is similarly deposited in this opening portion by electroplating, so that the other wiring and land is formed.

Figure 7A:
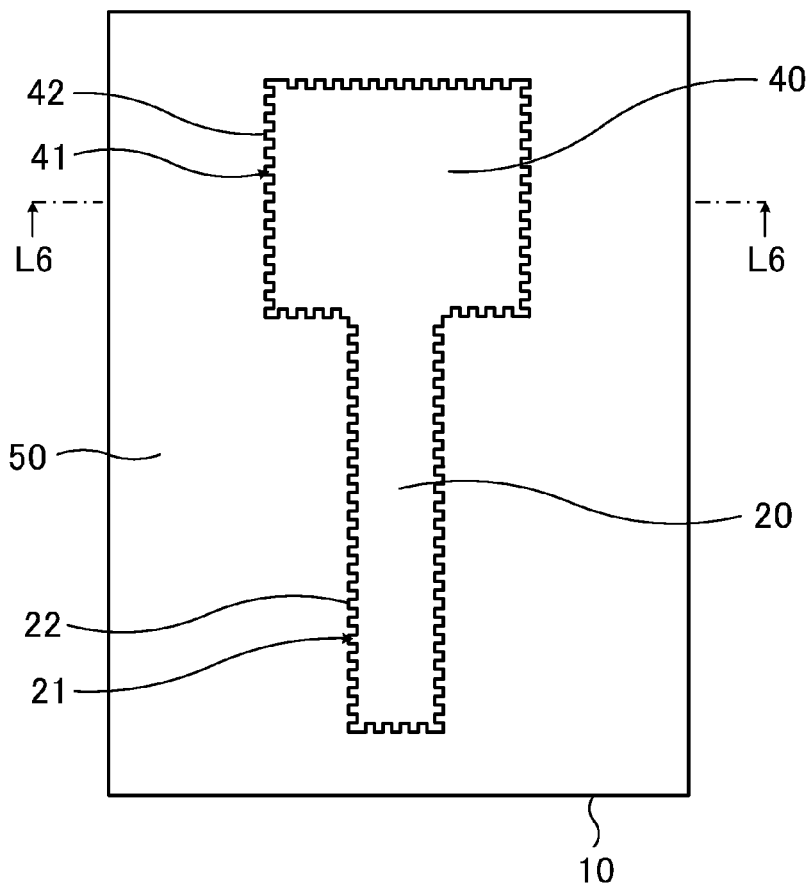
FIGS. 7A and 7B are explanatory diagrams of a process of removing the mask.
Figure 7B:
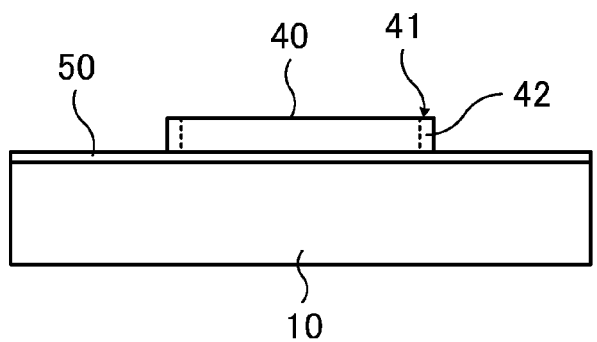

FIGS. 7A and 7B are explanatory diagrams of a process of removing the mask. Here, FIG. 7A is a main-part plane schematic diagram, and FIG. 7B is a schematic diagram of a section taken along a line L6-L6 in FIG. 7A.

After the wiring 20 and the land 40 are formed, the mask 60 is removed as illustrated in FIGS. 7A and 7B. The mask 60 is removed by a technique suitable for the type of material used for the mask 60, such as dissolution by a solvent, dry etching, or peeling. This removal of the mask 60 exposes the feeding layer 50.

Figure 8A:
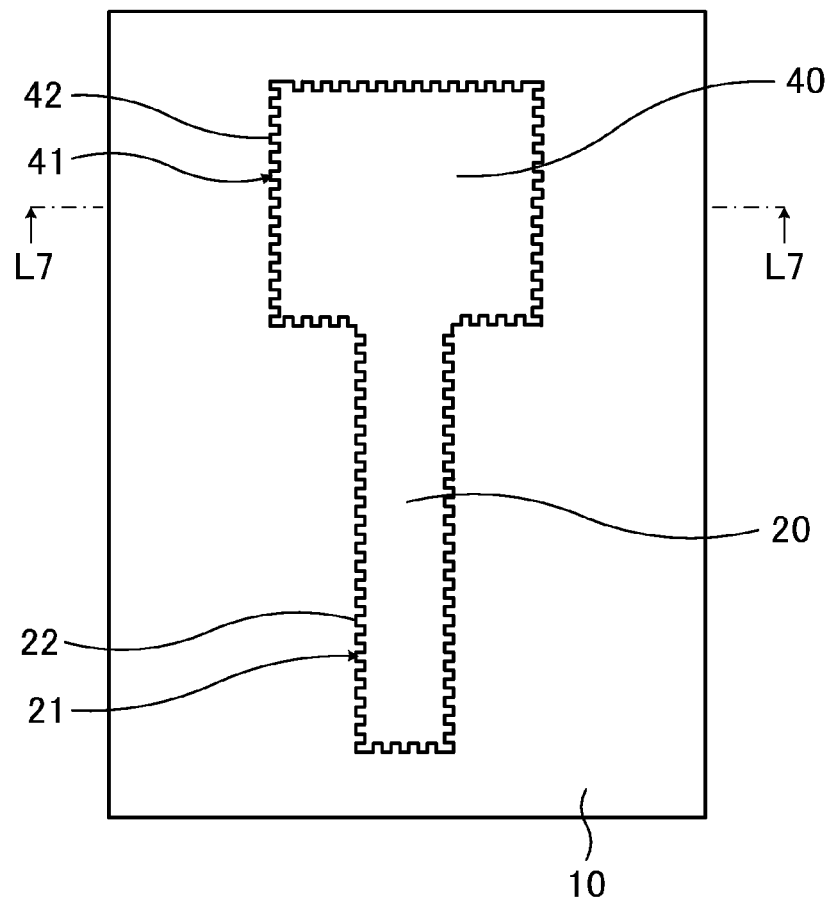
FIGS. 8A and 8B are explanatory diagrams of a process of removing the feeding layer.
Figure 8B:
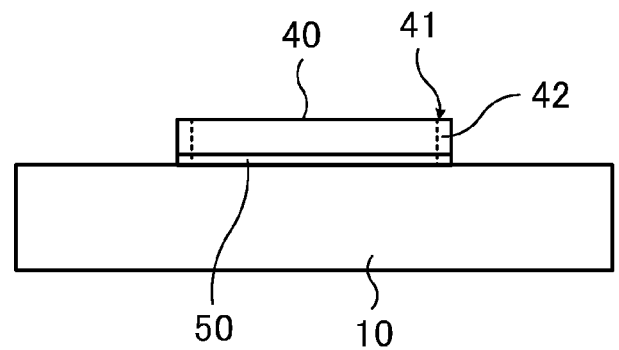

FIGS. 8A and 8B are explanatory diagrams of a process for removing the feeding layer. Here, FIG. 8A is a main-part plane schematic diagram, and FIG. 8B is a schematic diagram of a section taken along a line L7-L7 in FIG. 8A.

After the mask 60 is removed, the feeding layer 50 exposed by the removal of the mask 60 is removed, as illustrated in FIGS. 8A and 8B. The feeding layer 50 exposed by the removal of the mask 60 is removed by, for example, wet etching or dry etching using the wiring 20 and the land 40 as a mask. As a result, the wiring 20 and the land 40 are electrically separated from the conductor pattern present therearound (separated from other wiring and lands formed on the substrate 10).

By the above-described processes illustrated in FIGS. 4A and 4B to FIGS. 8A and 8B, the wiring 20 having the uneven section 22 and the land 40 having the uneven section 42 are formed on the substrate 10 serving as the main body of the electronic component 1a. After the wiring 20 and the land 40 are formed, the insulating film 30 is formed as illustrated in FIGS. 9A and 9B as well as FIGS. 10A and 10B.

Figure 9A:
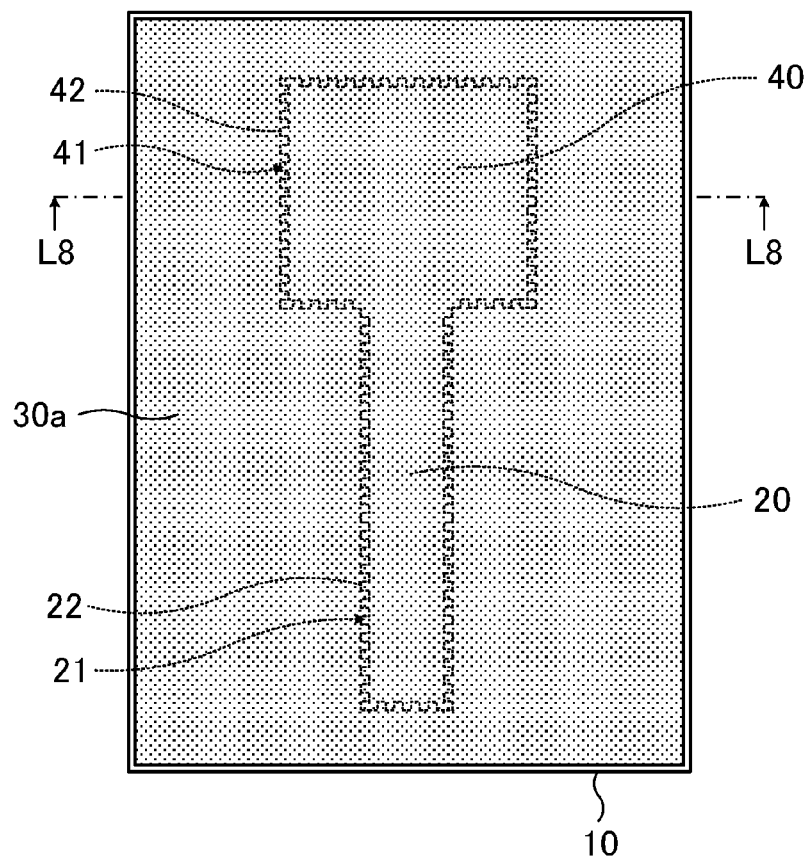
FIGS. 9A and 9B are explanatory diagrams of a process of applying and drying a resin.
Figure 9B:
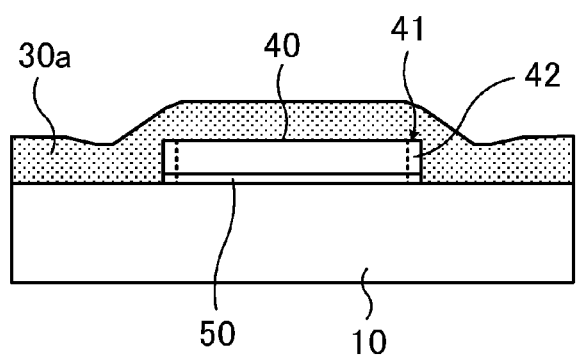

FIGS. 9A and 9B are explanatory diagrams of a process of applying and drying a resin. Here, FIG. 9A is a main-part plane schematic diagram, and FIG. 9B is a schematic diagram of a section taken along a line L8-L8 in FIG. 9A.

After the wiring 20 and the land 40 are formed, first, a resin 30a used for the insulating film 30 is applied and then dried. For example, first, the resin 30a having photosensitivity and containing a substance such as PBO and PI is applied by spin coating or the like, onto the substrate 10 where the wiring 20 and the land 40 are formed. Next, the resin 30a is dried (prebaked) at a predetermined temperature according to the type of (the component) of the resin 30a. During drying, thickness reduction of the resin 30a applied onto the substrate 10 may occur. A thickness (an application thickness) of the resin 30a applied onto the substrate 10 is set based on a thickness of the resin film to be obtained after drying. For example, the application thickness is set so that the resin 30a after being dried achieves a thickness of about 5 μm on the substrate 10.

During application and drying of the resin 30a, the resin 30a is drawn toward the edge portion 21 of the wiring 20 and the edge portion 41 of the land 40, because the wiring 20 is provided with the uneven section 22 and the land 40 is provided with the uneven section 42, as described above. Therefore, even if a certain amount of thickness reduction occurs in the resin 30a during drying, a thickness reduction of the resin at the edge portion 21 and the edge portion 41 is suppressed, and the edge portion 21 and the edge portion 41 are not exposed at that time, or during subsequent development and curing.

Figure 10A:
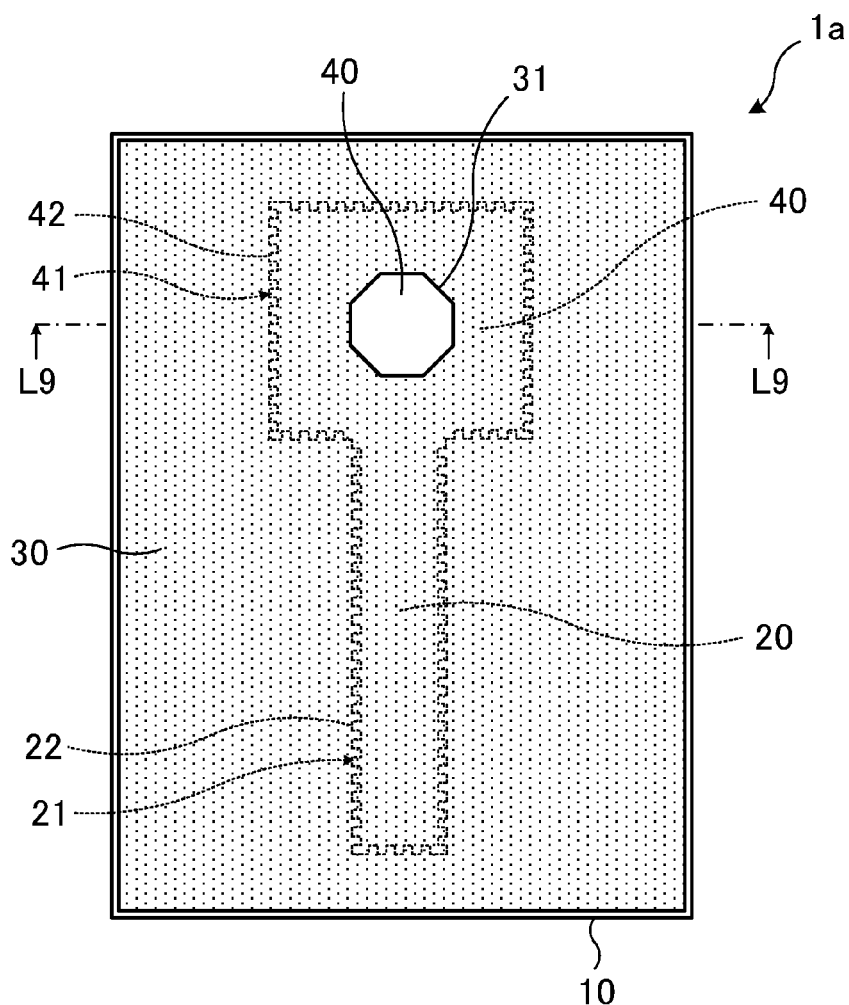
FIGS. 10A and 10B are explanatory diagrams of a process of performing light exposure, development, and curing of the resin.
Figure 10B:
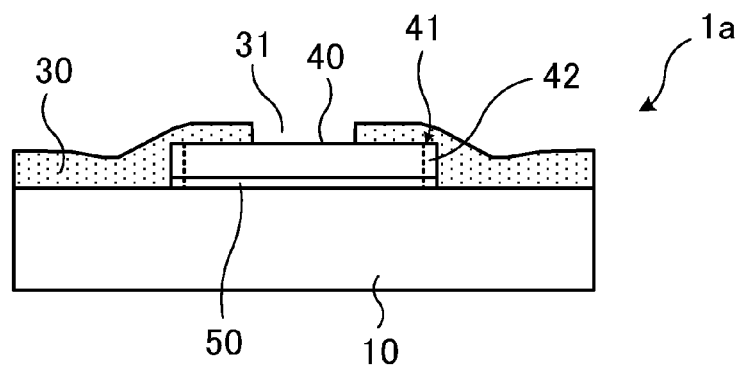

FIGS. 10A and 10B are explanatory diagrams of a process of performing light exposure, development, and curing of the resin. Here, FIG. 10A is a main-part plane schematic diagram, and FIG. 10B is a schematic diagram of a section taken along a line L9-L9 in FIG. 10A.

After the resin 30a is applied and dried, the resin 30a is cured by light exposure and development. First, the resin 30a in a region corresponding to a terminal formation region of the land 40 is exposed to light, and then, the resin 30a after light exposure is developed to form the opening portion 31. After the opening portion 31 is formed, the resin 30a is cured. As a result, the insulating film 30 having the opening portion 31 communicating with the land 40 is formed, as illustrated in FIGS. 10A and 10B.

The resin 30a at the edge portion 21 of the wiring 20 provided with the uneven section 22 and on the edge portion 41 of the land 40 provided with the uneven section 42 has a relatively large thickness, as compared with a case where the uneven section 22 and the uneven section 42 are not provided. During development and curing, a certain amount of thickness reduction may occur in the resin 30a. For example, the resin 30a having a thickness of about 5 jam may be reduced to a thickness of about 3 µm to 4 µm after development. When the wiring 20 is provided with the uneven section 22 and the land 40 is provided with the uneven section 42, exposure of the edge portion 21 of the wiring 20 and the edge portion 41 of the land 40 through the insulating film 30 is suppressed, even if such thickness reduction occurs.

Figure 11A:
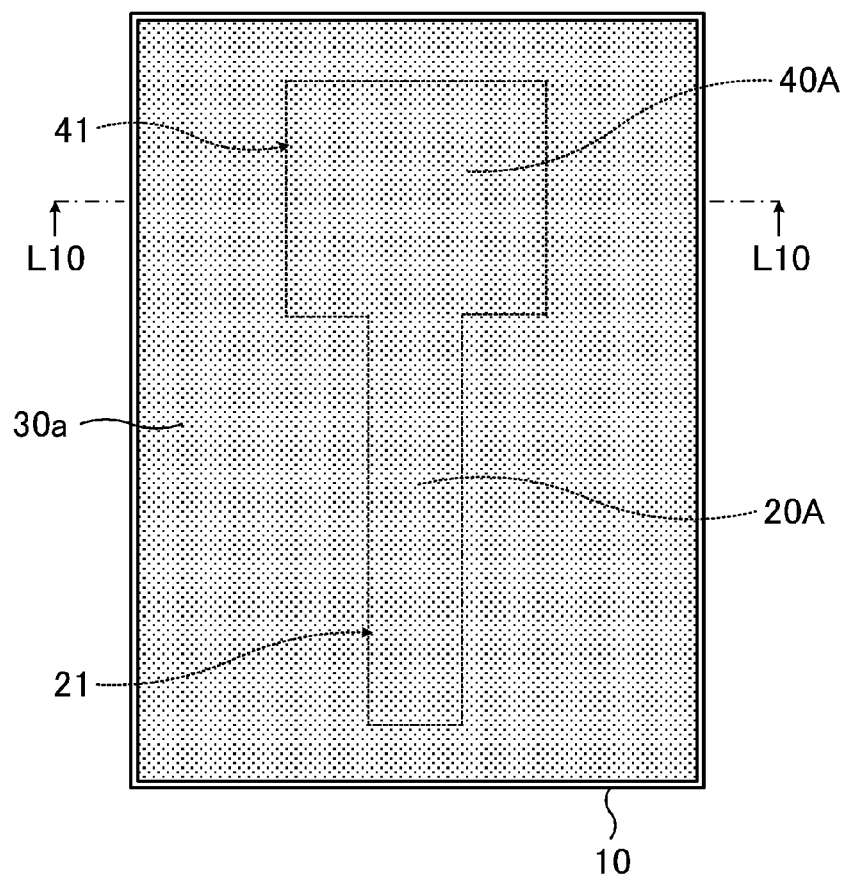
FIGS. 11A and 11B are explanatory diagrams of a process of applying and drying a resin according to another form.
Figure 11B:
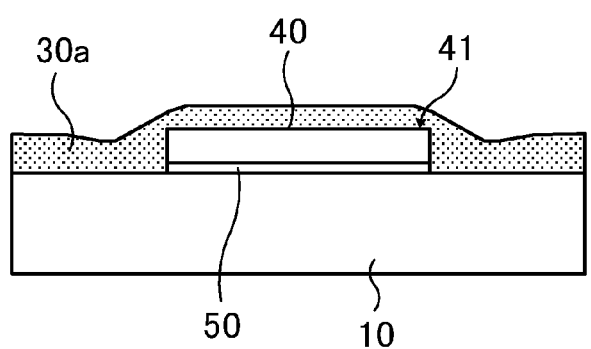

For a comparison, an example of forming the insulating film 30 on wiring and a land not provided with the uneven section 22 and the uneven section 42 is illustrated in FIGS. 11A and 11B as well as FIGS. 12A and 12B to be described below.

FIGS. 11A and 11B are explanatory diagrams of a process of applying and drying a resin according to another form. Here, FIG. 11A is a main-part plane schematic diagram, and FIG. 11B is a schematic diagram of a section taken along a line L10-L10 in FIG. 11A. FIGS. 12A and 12B are explanatory diagrams of a process of performing light exposure, development, and curing of the resin according to this form. Here, FIG. 12A is a main-part plane schematic diagram, and FIG. 12B is a schematic diagram of a section taken along a line L11-L11 in FIG. 12A.

First, according to a procedure similar to the example described with reference to FIGS. 4A and 4B to FIGS. 8A and 8B, the wiring 20A not having the uneven section 22 and the land 40A not having the uneven section 42 are formed on the substrate 10 as illustrated in FIGS. 11A and 11B. Next, according to a procedure similar to the example described with reference to FIGS. 9A and 9B, the resin 30a is applied and then dried (FIGS. 11A and 11B). Further, according to a procedure similar to the example described with reference to FIGS. 10A and 10B, the resin 30a is subjected to light exposure, development, and curing to form the insulating film 30 having the opening portion 31 communicating with the land 40A (FIGS. 12A and 12B).

In the wiring 20A not having the uneven section 22 and the land 40A not having the uneven section 42, the effect of drawing the resin 30a toward the edge portion 21 and the edge portion 41 as described above is weak, and thickness reduction may occur in the applied and dried resin 30a. Due to such weakness of the effect of drawing the resin 30a as well as such thickness reduction, the resin 30a at the edge portion 21 of the wiring 20A and the edge portion 41 of the land 40A may become thin as illustrated in FIGS. 11A and 11B.

Figure 12A:
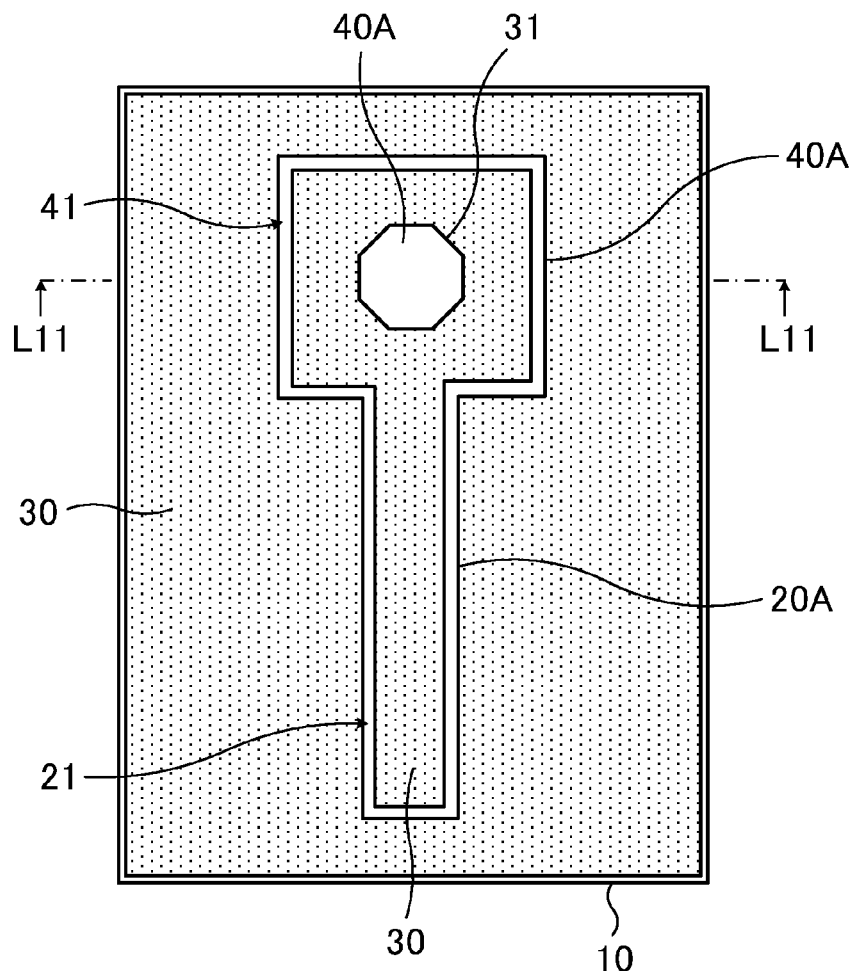
FIGS. 12A and 12B are explanatory diagrams of a process of performing light exposure, development, and curing of the resin according to another form.
Figure 12B:
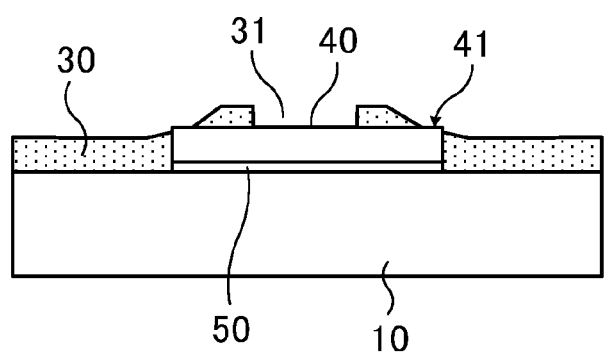

When the light exposure and development are performed from such a state and further the curing is performed, the edge portion 21 of the wiring 20 and the edge portion 41 of the land 40 may be exposed through the formed insulating film 30 as illustrated in FIG. 12A and FIG. 12B, due to an occurrence of further thickness reduction in the resin 30a. This exposure of the edge portion 21 of the wiring 20 and the edge portion 41 of the land 40 through the insulating film 30 may cause a malfunction such as a short, thereby reducing the reliability of the electronic component.

In contrast, according to the method of forming described with reference to FIGS. 4A and 4B to FIGS. 10A and 10B, exposure of the edge portion 21 of the wiring 20 and the edge portion 41 of the land 40 through the insulating film 30 may be suppressed, so that the electronic component is of high reliability is achievable.

In the electronic component 1a, a conductor layer such as an under bump metal (UBM), a conductor layer having a multilayer film of Ni and Au, a bump such as solder and a Cu pillar, and the like may be provided on the terminal (the land 40) exposed in the opening portion 31 of the insulating film 30, after the insulating film 30 is formed.

Further, in the electronic component 1a, when two or more conductor patterns each including the wiring 20 and the land 40 are provided on the substrate 10 and these conductor patterns are disposed in proximity to each other, an uneven section may not be provided at a proximity part.

Figure 13:
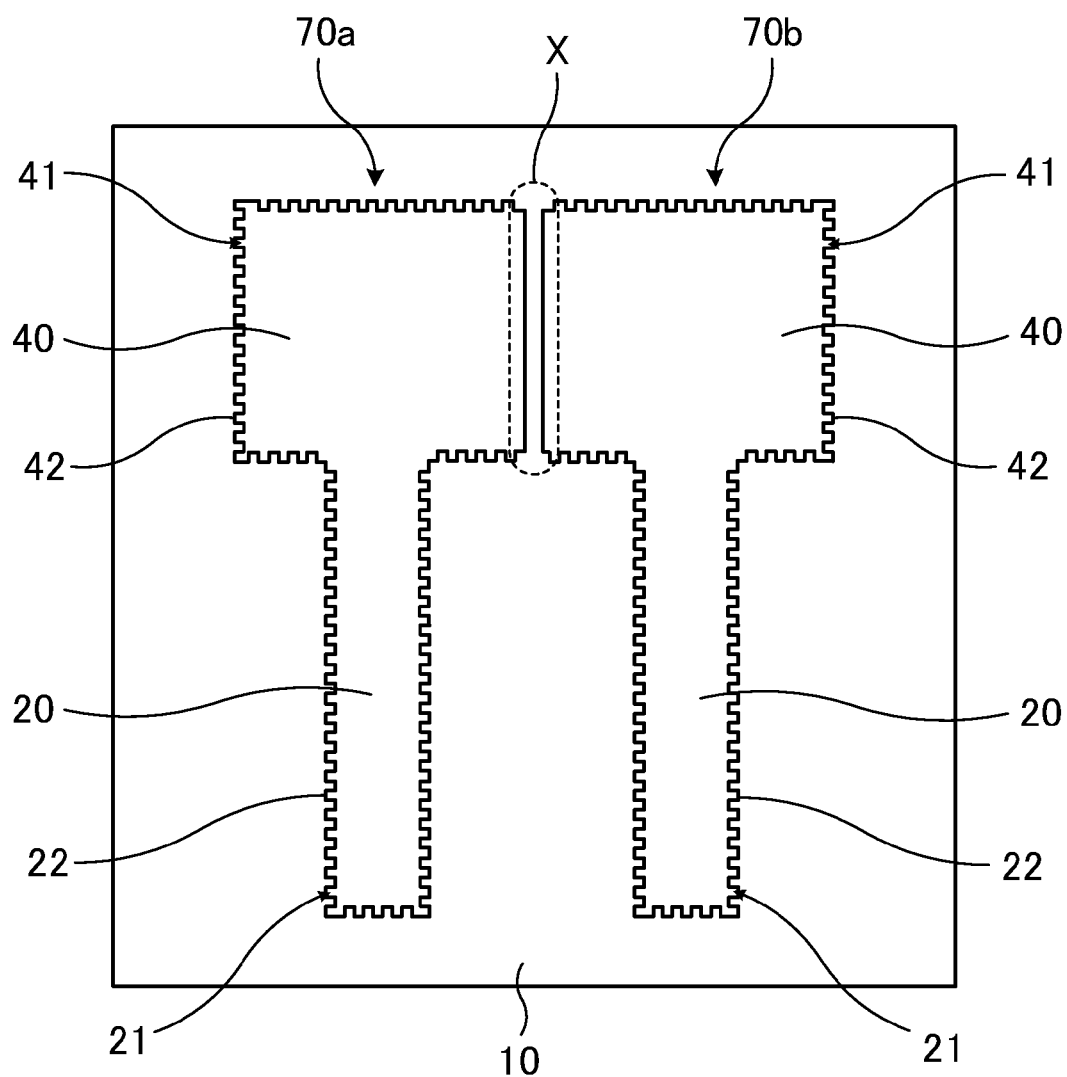
FIG. 13 is an explanatory diagram of a conductor pattern (Part 1)
Figure 14:
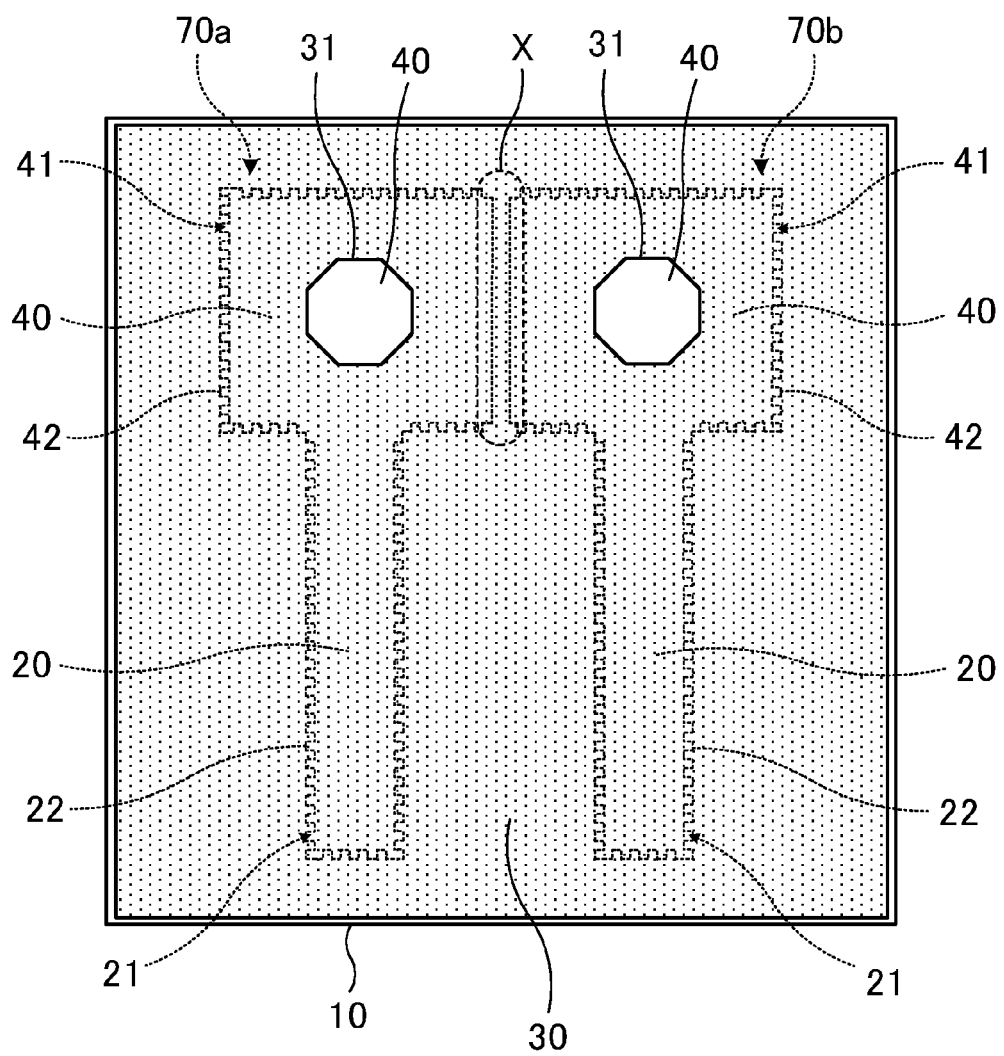
FIG. 14 is an explanatory diagram of the conductor pattern (Part 2)

FIGS. 13 and 14 are explanatory diagrams of a conductor pattern.

Here, FIG. 13 is a main-part plane schematic diagram of an example of a state where a conductor pattern is provided on a substrate, and FIG. 14 is a main-part plane schematic diagram of an example of a state where an insulating film is provided on the substrate provided with the conductor pattern.

In the example illustrated in FIG. 13, two conductor patterns 70a and 70b each including the wiring 20 and the land 40 are provided next to each other on the substrate 10. The land 40 (one side thereof) of the conductor pattern 70a and the land 40 (one side thereof) of the conductor pattern 70b are disposed to face each other while being in proximity to each other. When the conductor patterns 70a and 70b are thus disposed, the uneven section 42 may not be provided at each of the edge portions 41 facing each other of the respective lands 40 in a part X where the conductor patterns 70a and 70b are in proximity to each other, as illustrated in FIG. 13.

As illustrated in FIG. 14, the insulating film 30 having the opening portions 31 communicating with the respective lands 40 is formed on the substrate 10 provided with the conductor patterns 70a and 70b, according to the procedure described with reference to FIGS. 9A and 9B as well as FIGS. 10A and 10B.

Figure 15:
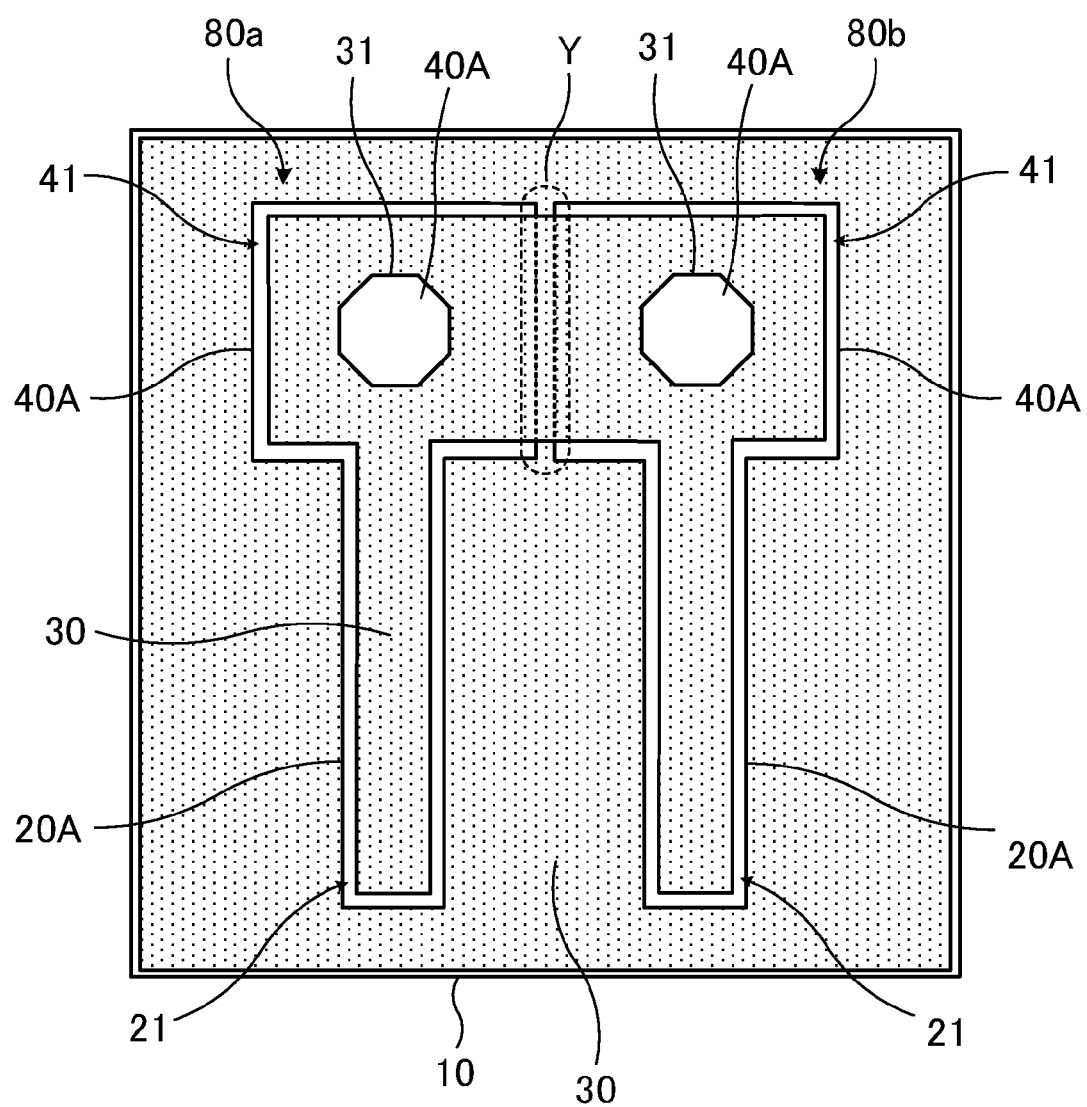
FIG. 15 is an explanatory diagram of a conductor pattern according to another form.

Here, for a comparison, FIG. 15 illustrates a conductor pattern according to another form.

In FIG. 15, two conductor patterns 80a and 80b each including the wiring 20A not having the uneven section 22 and the land 40A not having the uneven section 42 are disposed next to each other so that the respective lands 40A are in proximity to each other. On the substrate 10 provided with the conductor patterns 80a and 80b thus disposed, the insulating film 30 having the opening portions 31 communicating with the respective lands 40A are formed according to a procedure similar to the procedure described above.

In this case, in the conductor patterns 80a and 80b each having no uneven section 22 and uneven section 42, the edge portion 21 and the edge portion 41 may be exposed through the formed insulating film 30, as described above. However, exposure of the edge portions 41 through the insulating film 30 is suppressed in a part Y where the respective lands 40A are in proximity to each other, as illustrated in FIG. 15. This is because the edge portions 41 of the respective lands 40A are in proximity to each other, and therefore, the resin 30a applied at the time of forming the insulating film 30 tend to remain in (are resistant to flowing out from) a region between the respective edge portions 41, thereby suppressing such a phenomenon that the resin 30a at the respective edge portions 41 becomes thin.

Therefore, in the conductor patterns 70a and 70b each provided with the uneven sections 22 and 42 as illustrated in FIG. 14, the uneven section 42 may not be provided at each of the respective edge portions 41 in the part X where the respective lands 40 are in proximity to each other. A thickness reduction of the applied resin 30a on the respective edge portions 41 may be suppressed without providing the uneven sections 42 at the respective edge portions 41 in the part X where the respective lands 40 are in proximity to each other. This may suppress exposure of the edge portions 41 though the insulating film 30, even if the edge portions 41 are not provided with the respective uneven sections 42.

Whether to provide the uneven section 42 at each of the edge portions 41 facing each other of the respective lands 40 may be set, for example, based on a thickness of each of the conductor patterns 70a and 70b, the type (such as viscosity) of the resin 30a, and a distance (a degree of proximity) between the lands 40. Further, this may be also set based on conditions (a degree of thickness reduction) of the drying, the development, and the curing of the resin 30a in forming the insulating film 30, and the like. Based on these conditions, it may be determined whether exposure of the edge portions 41 though the insulating film 30 is suppressed without providing the uneven sections 42 at the respective edge portions 41, so that whether to provide the uneven section 42 may be determined.

For example, the uneven section 42 is not provided at each of the edge portions 41 facing each other of the respective lands 40, when the distance between the lands 40 is three times or more longer than the thickness of the resin 30a before development, depending on the thickness of each of the conductor patterns 70a and 70b, the type of the resin 30a, the conditions of the drying, the development, and the curing of the resin 30a, and the like. One example is as follows. When the thickness of each of the conductor patterns 70a and 70b is about 5 μm and the thickness of the resin 30a before development is about 5 μm, the uneven section 42 may not be provided at the edge portion 41 of each of the lands 40 facing each other at a distance of about 15 μm or less.

Here, the example of not providing the uneven section 42 at each of the edge portions 41 facing each other between the lands 40 is described. However, of course, the part not provided with the uneven section is not limited to this example.

Figure 16A:
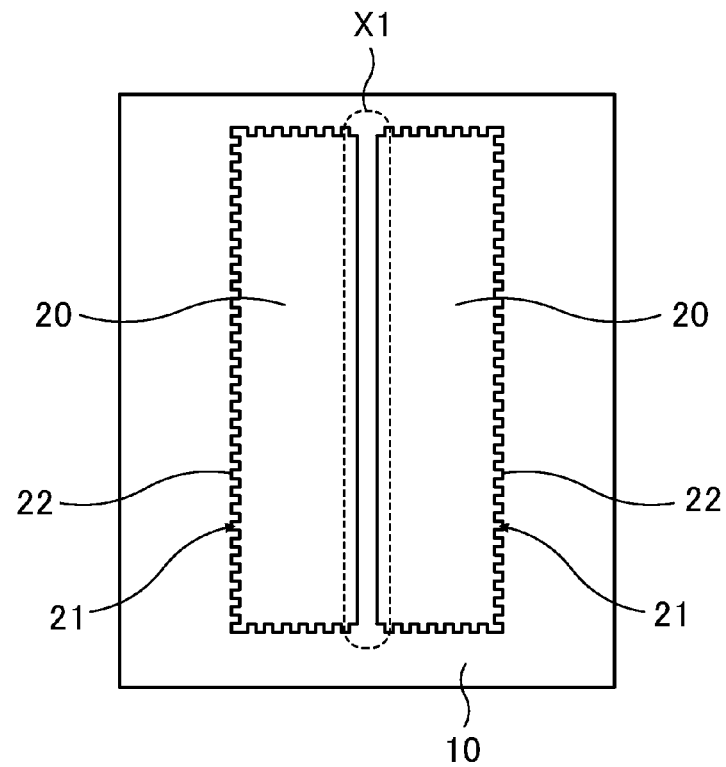
FIGS. 16A and 16B are explanatory diagrams each illustrating a modification of the conductor pattern.
Figure 16B:
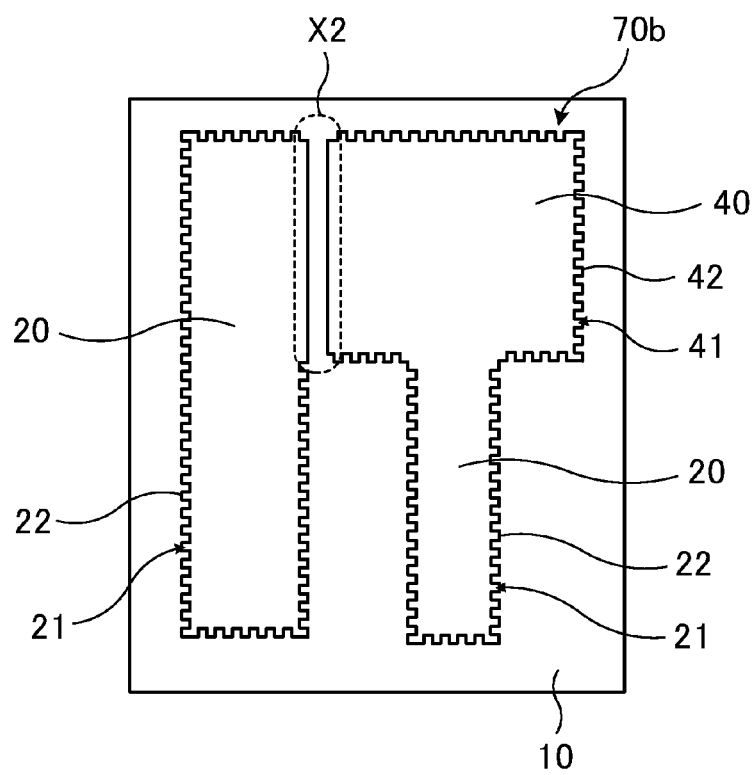

FIGS. 16A and 16B are explanatory diagrams of a modification of the conductor pattern. Here, FIG. 16A is a main-part plane schematic diagram of an example of a state where a conductor pattern of a first modification is provided on a substrate, and FIG. 16B is a main-part plane schematic diagram of an example of a state where a conductor pattern of a second modification is provided on a substrate.

For example, as illustrated in FIG. 16A, the uneven section 22 may not be provided at each of the edge portions 21 facing each other of the two wirings 20 disposed in proximity to each other on the substrate 10. Specifically, the uneven section 22 is not provided at each of the edge portions 21 in a part X1 where the wirings 20 are in proximity to each other. In this case as well, exposure of the edge portions 21 of these wirings 20 through the insulating film 30 may be suppressed.

Further, as illustrated in FIG. 16B, the uneven section 22 and the uneven section 42 may not be provided respectively at the edge portion 21 and the edge portion 41 facing each other, between the wiring 20 and the land 40 of the conductor pattern 70b that are provided in proximity to each other on the substrate 10. The uneven section 22 and the uneven section 42 are not provided respectively at the edge portion 21 and the edge portion 41 facing each other in a part X2 where the wiring 20 and the land 40 are in proximity to each other. In this case as well, exposure of the edge portion 21 of the wiring 20 and the edge portion 41 of the land 40 through the insulating film 30 may be suppressed.

Figure 17:
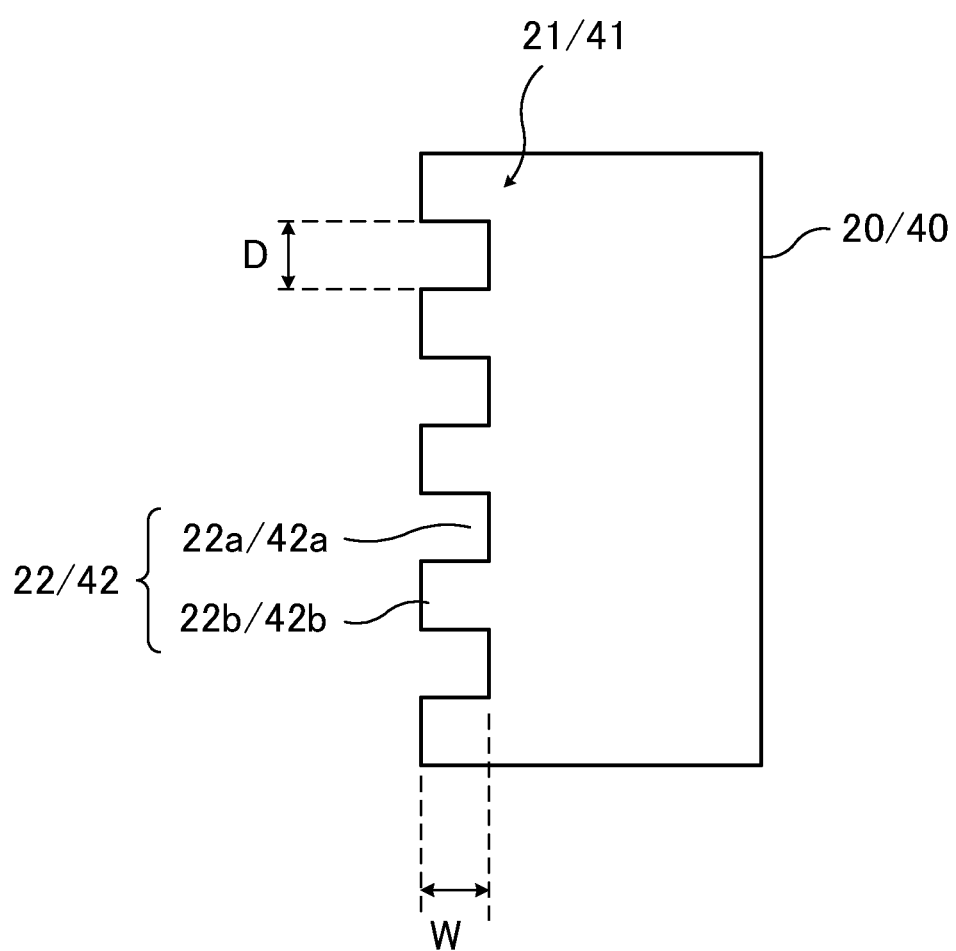
FIG. 17 is an explanatory diagram of an uneven section (Part 1)

FIGS. 17 and 18 are explanatory diagrams of the uneven section.

The size of each of the uneven section 22 of the wiring 20 and the uneven section 42 of the land 40 may be set based on the thickness of each of the wiring 20 and the land 40, the type of the resin 30a used to form the insulating film 30, the conditions of the drying, the development, and the curing of the resin 30a, and the like.

For example, for the uneven section 22 and the uneven section 42 illustrated in FIG. 17, a distance D and a width W are set based on the thickness of each of the wiring 20 and the land 40, the type of the resin 30a, the conditions of the drying, the development, and the curing of the resin 30a, and the like. The distance D and the width W may each be, for example, of a size double or less the thickness of the resin 30a before development, depending on the thickness of each of the wiring 20 and the land 40, the type of the resin 30a, the conditions of the drying, the development, and the curing of the resin 30a, and the like. One example is as follows. When the thickness of each of the wiring 20 and the land 40 is about 5 μm, and the thickness of the resin 30a before development is about 5 μm, the distance D and the width W of each of the uneven section 22 and the uneven section 42 may both be about 3 μm.

The distance D and the width W of each of the uneven section 22 and the uneven section 42 may be of the same size, but may be of different sizes (the distance D is longer than the width W, or the distance D is shorter than the width W).

Further, the distance D and the width W of the uneven section 22 of the wiring 20 and the distance D and the width W of the uneven section 42 of the land 40 may be different from each other.

Figure 18A:
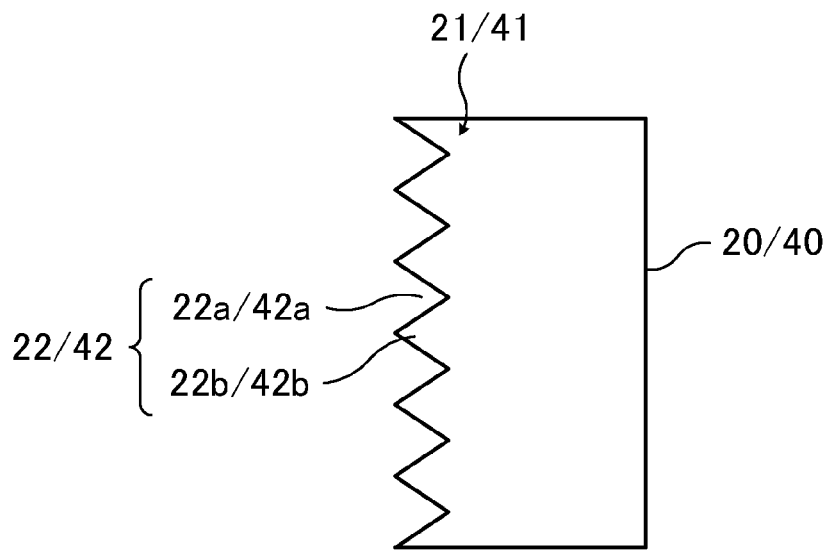
FIGS. 18A and 18B are explanatory diagrams of the uneven section (Part 2)
Figure 18B:
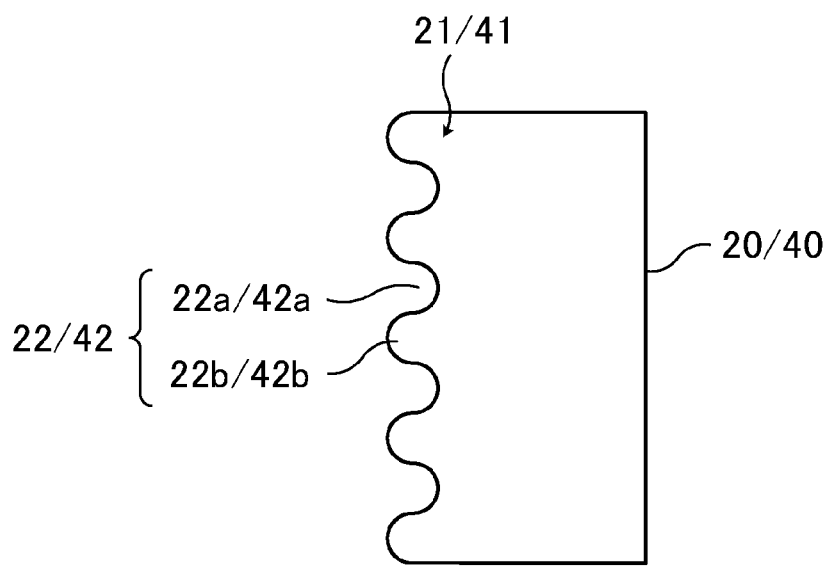

Furthermore, the shape of each of the uneven section 22 and the uneven section 42 may not be a rectangular planar shape. For example, the uneven section 22 and the uneven section 42 may each be a triangle planar shape as illustrated in FIG. 18A, or a planar shape in which corners of the depressions 22a and 42a as well as the projections 22b and 42b are rounded as illustrated in FIG. 18B. The shape of the uneven section 22 and the shape of the uneven section 42 may be different from each other.

As the uneven section 22 and/or the uneven section 42 of the conductor pattern including the wiring 20, the land 40, or the wiring 20 and the land 40 are finer and larger in number, the surface areas of the edge portions 21 and 41, the contact area on the resin 30a, and the surface tension of the resin 30a become greater. The sizes and the shapes of the uneven sections 22 and 42 may be set, based on the film thickness of each of the wiring 20 and the land 40, the type of the resin 30a, the conditions of the drying, the development, and the curing of the resin 30a, and the like.

When the resin 30a is applied by spin coating in forming the insulating film 30, the thickness of the resin 30a on an inner side close to a rotation center may be greater than the thickness on an outer side away from the rotation center, depending on a rotation condition of the substrate 10, the type of the resin 30a, and the like. In such a case, as to the size or shape of the uneven section provided at the edge portion of the conductor pattern, a part on the inner side close to the rotation center of the substrate 10 and a part on the outer side away from the rotation center may be different from each other, based on findings about in-plane distribution occurring in the resin 30a on the substrate 10. Further, the uneven section may not be provided at each of the edge portions facing each other between the conductor patterns located in proximity to each other on the inner side close to the rotation center of the substrate 10, while the uneven section may be provided at each of the edge portions facing each other between the conductor patterns located in proximity to each other on the outer side away from the rotation center.

The electronic components 1, 1a, and the like are described above.

Next, configuration examples of the substrate 10 (the main body of the electronic component 1, 1a, or the like) capable of being provided with the wiring 20 having the uneven section 22 and the land 40 having the uneven section 42 as described above will be described with reference to FIGS. 19 to 22 as follows.

Figure 19:
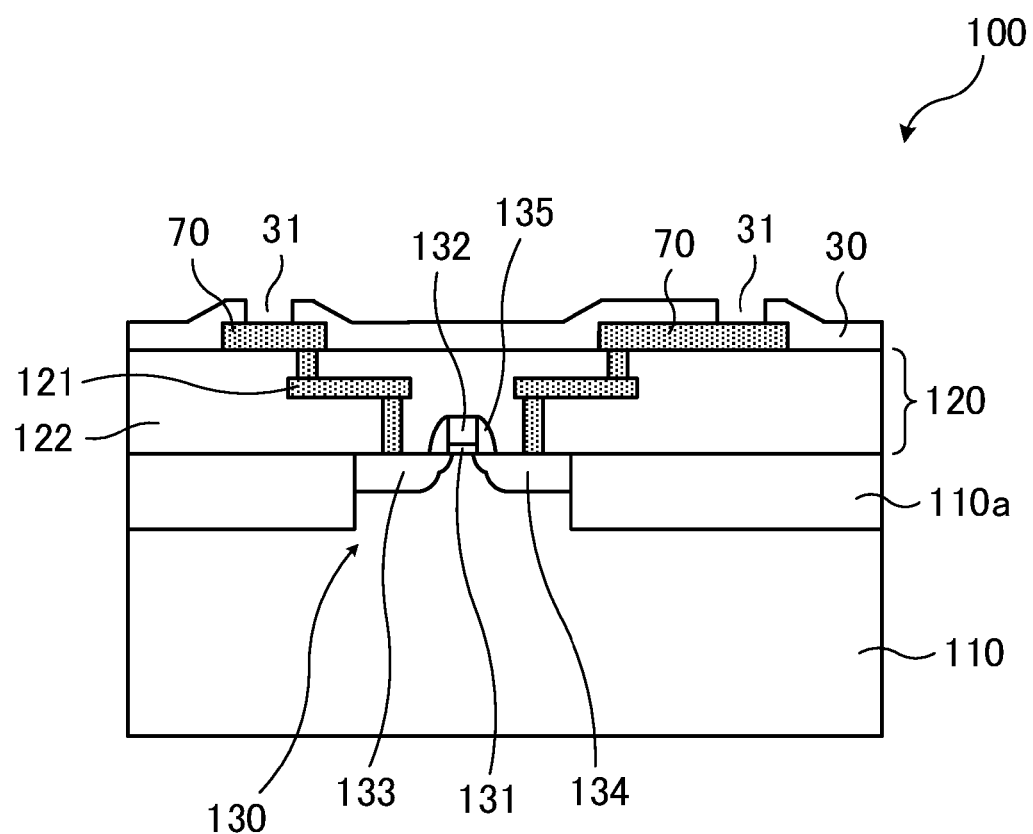
FIG. 19 is a diagram illustrating a first configuration example of a semiconductor element.

FIG. 19 is a diagram illustrating a first configuration example of the semiconductor element. Here, FIG. 19 is a main-part plane schematic diagram of a semiconductor element according to the first configuration example.

A semiconductor element 100 (an electronic component) illustrated in FIG. 19 has a semiconductor substrate 110 where an element such as a transistor is provided, and a wiring layer 120 provided on the semiconductor substrate 110.

A substrate of Si, germanium (Ge), silicon germanium (SiGe), or the like is used for the semiconductor substrate 110. An element such as a transistor, a capacitor, and a resistor is formed on the semiconductor substrate 110. As an example of the element, a metal oxide semiconductor (MOS) transistor 130 is illustrated in FIG. 19.

The MOS transistor 130 is provided in an element region defined by an element isolation region 110a provided in the semiconductor substrate 110. The MOS transistor 130 has a gate electrode 132 formed on the semiconductor substrate 110 with a gate insulating film 131 interposed therebetween, and a source region 133 and a drain region 134 formed in the semiconductor substrate 110 on both sides of the gate electrode 132. A spacer 135 made of an insulating film is provided on a sidewall of the gate electrode 132.

On the semiconductor substrate 110 provided with the MOS transistor 130 or the like as described above, the wiring layer 120 is provided. The wiring layer 120 has a conductor section 121 (wiring and a via) electrically connected to the MOS transistor 130 or the like provided in the semiconductor substrate 110, and an insulating section 122 covering the conductor section 121. FIG. 19 illustrates the conductor section 121 electrically connected to the source region 133 and the drain region 134 of the MOS transistor 130, as an example. Various kinds of conductive material such as Cu, Al, and tungsten (W) may be used for the conductor section 121. Inorganic insulating materials such as silicon oxide (SiO) and organic insulating materials such as resin may be used for the insulating section 122.

For example, a structure including the semiconductor substrate 110 and the wiring layer 120 provided thereon as described above corresponds to the substrate 10 (the main body of the electronic component) described above. On the wiring layer 120, a conductor pattern 70 including the wiring 20 having the uneven section 22 and the land 40 having the uneven section 42 as described above is provided, and further, the insulating film 30 having the opening portion 31 communicating with the conductor pattern 70 is provided as a protective film.

In the semiconductor element 100, for example, the wiring layer 120 has a thickness of 10 μm or less, the conductor pattern 70 has a thickness of about 5 μm, and the insulating film 30 has a thickness of about 10 μm.

Figure 20:
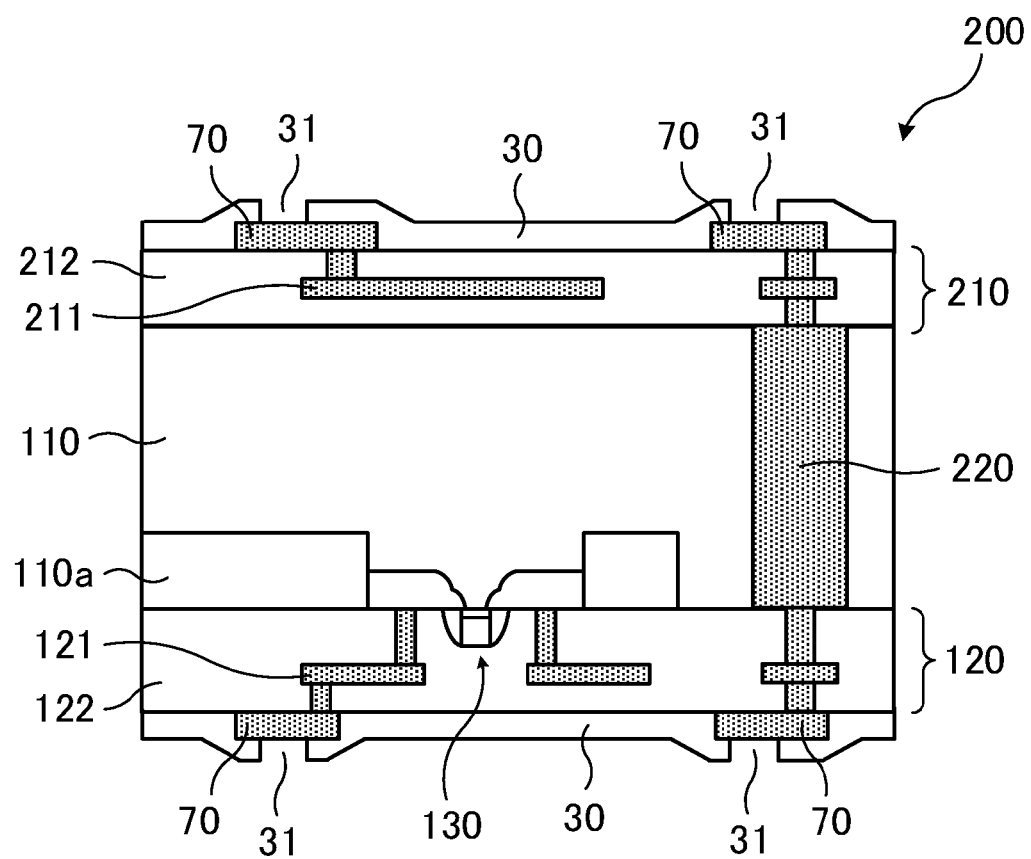
FIG. 20 is a diagram illustrating a second configuration example of the semiconductor element.

FIG. 20 is a diagram illustrating a second configuration example of the semiconductor element. Here, FIG. 20 is a main-part plane schematic diagram of a semiconductor element according to the second configuration example.

A semiconductor element 200 (an electronic component) illustrated in FIG. 20 has such a configuration that a wiring layer (a rewiring layer) 210 is provided on a backside (a surface opposite to a surface where the MOS transistor 130 or the like is disposed) of the semiconductor substrate 110 of the semiconductor element 100 illustrated in FIG. 19 described above. As with the wiring layer 120, the rewiring layer 210 has a conductor section 211 (wiring and a via) composed of any kind of conductive material, and an insulating section 212 composed of any kind of insulating material and covering the conductor section 211. The wiring layer 120 and the rewiring layer 210 are electrically connected to the semiconductor substrate 110 by a TSV 220.

For example, a structure including the semiconductor substrate 110 including the TSV 220, as well as the wiring layer 120 and the rewiring layer 210, which are provided on the front side and the back side, respectively, of the semiconductor substrate 110, corresponds to the substrate 10 (the main body of the electronic component) described above. On the wiring layer 120, as described with reference to FIG. 19, the conductor pattern 70 including the wiring 20 having the uneven section 22 and the land 40 having the uneven section 42 as described above is provided, and further, the insulating film 30 having the opening portion 31 communicating with the conductor pattern 70 is provided. Likewise, on the rewiring layer 210, the conductor pattern 70 that includes the wiring 20 having the uneven section 22 and the land 40 having the uneven section 42 is provided, and further, the insulating film 30 having the opening portion 31 communicating with the conductor pattern 70 is provided.

Reducing the thickness of each of the semiconductor element 100 illustrated in FIG. 19 and the semiconductor element 200 illustrated in FIG. 20 allows downsizing of these elements themselves as well as downsizing of a device composed of these elements. In addition, in the semiconductor element 200 illustrated in FIG. 20, it may be preferable to reduce the thickness of the semiconductor substrate 110, to provide the TSV 220 accurately or effectively, in some cases. It is effective to reduce a diameter of the TSV 220 in order to increase an integration density, but it is preferable to reduce the thickness of the semiconductor substrate 110 to form the TSV 220 having a small diameter. In the semiconductor element 100 and the semiconductor element 200 reduced in thickness from such a point of view, it is desirable to form the insulating film 30 having a small thickness, in order to suppress warpage that occurs at the time of heating, such as at the time of making connection to another component.

When such a demand for formation of the insulating film 30 having a small thickness is satisfied, the edge portion 21 and the edge portion 41 may be exposed through the insulating film 30 having a small thickness, in the wiring 20 not having the uneven section 22 and the land 40 not having the uneven section 42. On the other hand, in the wiring 20 having the uneven section 22 and the land 40 having the uneven section 42, exposure of the edge portion 21 and the edge portion 41 through the insulating film 30 having a small thickness may be effectively suppressed. According to the above-described technique of providing the uneven section 22 and the uneven section 42, the semiconductor element 100 and the semiconductor element 200 each having a small thickness and suppressing exposure of the wiring 20 and the land 40 through m the insulating film 30 having a small thickness are achievable.

Figure 21:
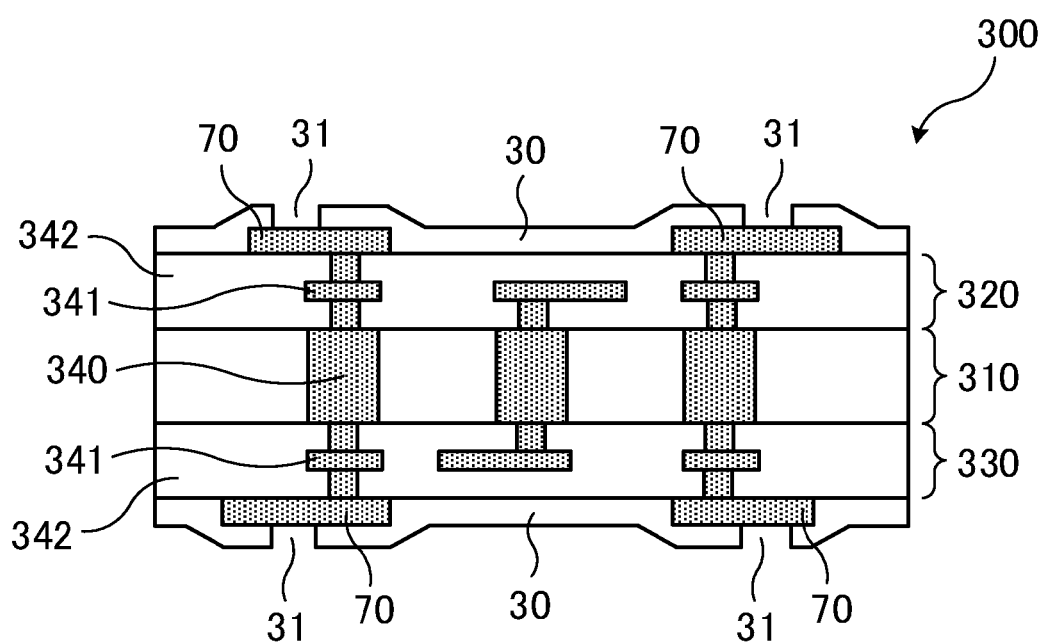
FIG. 21 is a diagram illustrating a configuration example of a circuit board.

FIG. 21 is a diagram illustrating a configuration example of a circuit board. Here, FIG. 21 is a main-part plane schematic diagram of the circuit board.

A circuit board 300 (an electronic component) illustrated in FIG. 21 has a core layer 310 provided with a through electrode 340, and a wiring layer 320 as well as a wiring layer 330 provided on the core layer 310. Various kinds of insulating material such as resin and ceramic may be used for the core layer 310. The wiring layer 320 and the wiring layer 330 each have a conductor section 341 (wiring and a via) composed of any kind of conductive material such as Cu and Al, and an insulating section 342 composed of any kind organic or inorganic insulating materials and covering the conductor section 341. The wiring layer 320 and the wiring layer 330 are electrically connected to each other by the through electrode 340 of the core layer 310.

For example, a structure including the core layer 310, the wiring layer 320, and the wiring layer 330 described above corresponds to the substrate 10 (the main body of the electronic component) described above. On the wiring layer 320, the conductor pattern 70 including the wiring 20 having the uneven section 22 and the land 40 having the uneven section 42 as described above is provided, and further, the insulating film 30 having the opening portion 31 communicating with the conductor pattern 70 is provided as a protective film. Likewise, on the wiring layer 330, the conductor pattern 70 including the wiring 20 having the uneven section 22 and the land 40 having the uneven section 42 as described above is provided, and further, the insulating film 30 having the opening portion 31 communicating with the conductor pattern 70 is provided as a protective film.

The circuit board 300 is, for example, a printed board such as a build-up board and an interposer. Further, a Si interposer using a Si substrate as the core layer 310 and provided with a TSV as the through electrode 340 may also adopt a configuration similar to the configuration of the circuit board 300 illustrated in FIG. 21.

Figure 22:
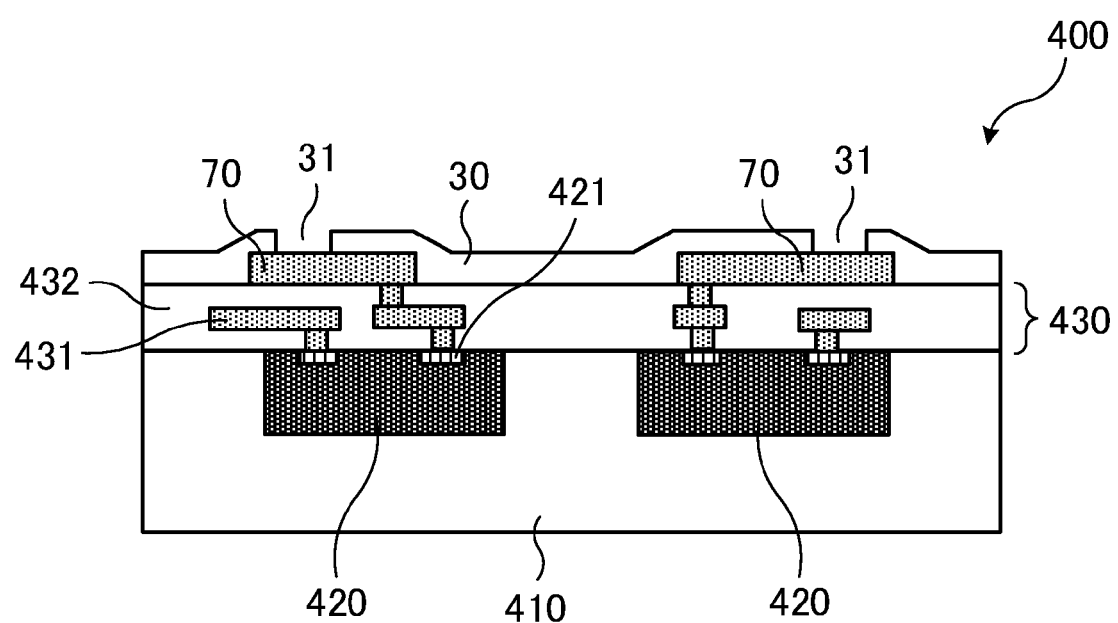
FIG. 22 is a diagram illustrating a configuration example of a pseudo-SoC.

Meanwhile, warpage may occur also in a pseudo-SoC having a semiconductor element embedded in a resin layer, as with the semiconductor element 200 reduced in thickness, and the like described above. FIG. 22 is a diagram illustrating a configuration example of the pseudo-SoC. Here, FIG. 22 is a main-part plane schematic diagram of the pseudo-SoC.

A pseudo-SoC 400 illustrated in FIG. 22 has a resin layer 410, two or more (here, two, as an example) semiconductor elements 420 embedded in the resin layer 410, and a wiring layer (a rewiring layer) 430 provided on the resin layer 410. The same or different various kinds of semiconductor elements are used for the semiconductor elements 420. The rewiring layer 430 has a conductor section 431 (wiring and a via) composed of any kind of conductive material such as Cu and Al, and an insulating section 432 composed of any kind of organic or inorganic insulating materials and covering the conductor section 211. The conductor section 431 is electrically connected to an electrode 421 provided in the semiconductor element 420.

For example, a structure including the resin layer 410 incorporating a group of the semiconductor elements 420 and the rewiring layer 430 thereon corresponds to the substrate 10 (the main body of the electronic component) described above. On the rewiring layer 430, the conductor pattern 70 including the wiring 20 having the uneven section 22 and the land 40 having the uneven section 42 is provided, and further, the insulating film 30 having the opening portion 31 communicating with the conductor pattern 70 is provided as a protective film.

In the resin layer 410, the semiconductor element 420 as a single element may be embedded. Further, besides the semiconductor element 420, another electronic component such as a chip capacitor may be embedded in the resin layer 410. Moreover, a through electrode may be provided in the resin layer 410, and a wiring layer (a rewiring layer) electrically connected to the rewiring layer 430 may be provided on a surface opposite to a surface where the rewiring layer 430 is disposed, of the resin layer 410.

The electronic components such as the semiconductor elements 100 and 200, the circuit board 300, and the pseudo-SoC 400 may each be electrically connected to another electronic component, by using the conductor pattern 70 (the land 40 thereof) exposed in the opening portion 31 of the insulating film 30, for a terminal (or a part of the terminal).

Figure 23:
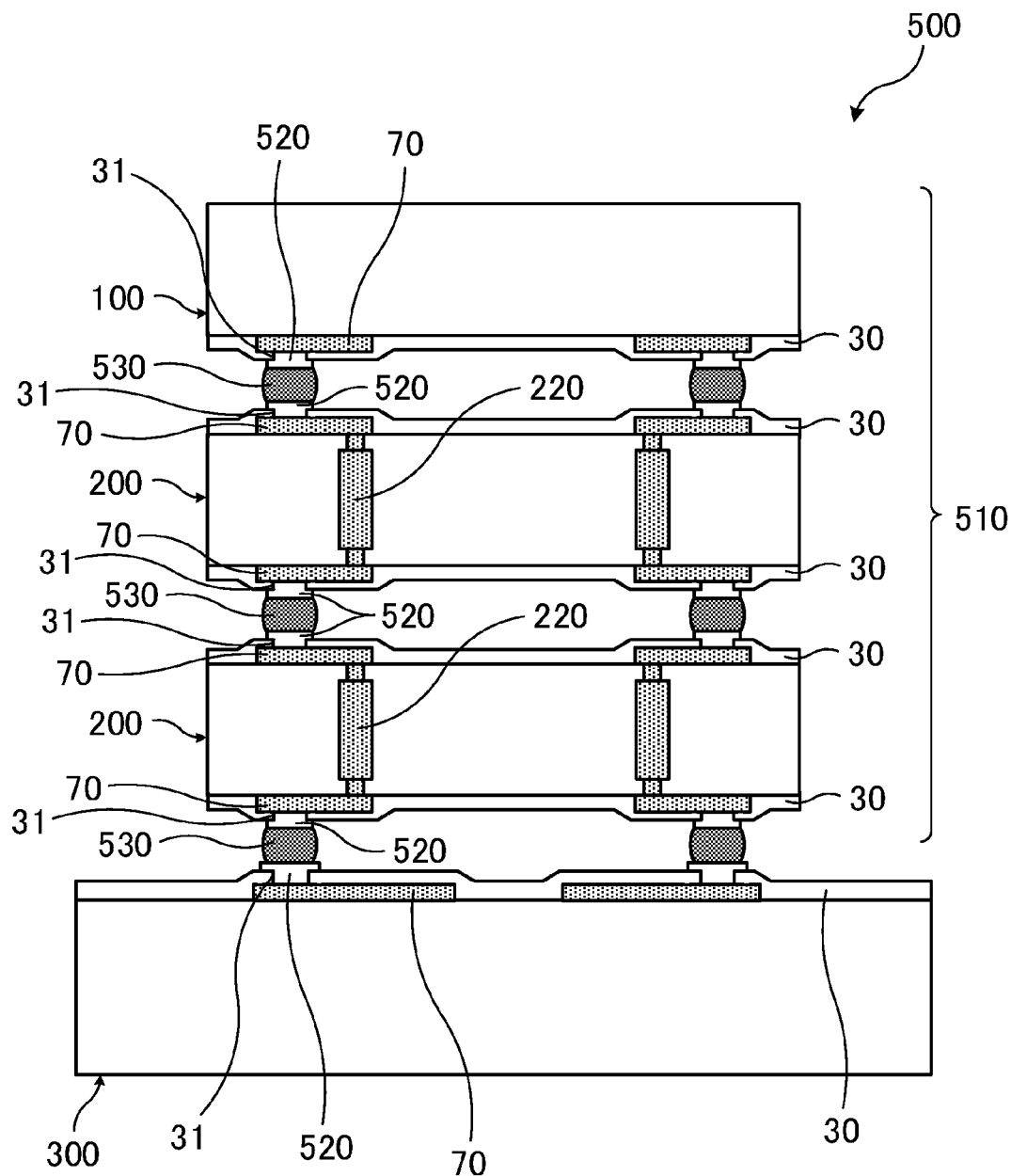
FIG. 23 is a diagram illustrating an example of an electronic device.

FIG. 23 is a diagram illustrating an example of an electronic device. Here, FIG. 23 is a main-part plane schematic diagram of this example of the electronic device.

FIG. 23 illustrates, as an example, an electronic device 500 having such a configuration that a semiconductor device 510, on which the semiconductor elements 100 and 200 described earlier are laminated, is implemented on the circuit board 300. FIG. 23 illustrates the configurations of the semiconductor element 100, the semiconductor element 200, and the circuit board 300 that are each simplified.

Here, as the semiconductor device 510, there is illustrated, by way of example, a structure in which the two semiconductor elements 200 each having the TSV 220 are laminated, and the one semiconductor element 100 is laminated thereon. For example, a barrier metal layer 520 is formed on the conductor pattern 70 (the land 40) exposed through each of the opening portions 31 of the insulating films 30, of each of the semiconductor element 200 and the semiconductor element 100.

The barrier metal layer 520 may be formed as follows, for example. First, after the insulating film 30 having the opening portion 31 is formed (FIGS. 10A and 10B), a feeding layer is formed, and then a mask for electroplating is formed. Next, by electroplating using the feeding layer and the mask, a conductor layer of Cu is formed, and further, a multilayer film of Ni and Au (a Ni/Au multilayer film) is formed on this conductor layer. Afterward, the mask is removed, and the feeding layer exposed after the removal of the mask is removed. As a result, the barrier metal layer 520 having the feeding layer, the Cu layer, and the Ni/Au multilayer film is formed on the conductor pattern 70 (the land 40). Here, the Cu layer may have a thickness of, for example, about 1 μm. Of the Ni/Au multilayer film, a Ni layer may have a thickness of, for example, about 3 µm, and an Au layer may have a thickness of, for example, about 0.1 µm.

The above-described electronic component may be completed by forming the barrier metal layer 520 after forming the insulating film 30 having the opening portion 31.

On at least one of the barrier metal layers 520 provided on the front and back sides (top and under surfaces), respectively, of each of the semiconductor element 100 and the semiconductor element 200 each thus provided with the barrier metal layer 520, a bump 530 such as solder is provided. The semiconductor element 200 on an upper-layer side is implemented on and electrically connected to the semiconductor element 200 on a lower-layer side via the bump 530, and the semiconductor element 100 is implemented on and electrically connected to the semiconductor element 200 on the upper-layer side via the bump 530. The semiconductor device 510 is thus obtained.

The semiconductor device 510 is implemented on the circuit board 300. The barrier metal layer 520 is likewise formed on the conductor pattern 70 (the land 40) exposed through the opening portion 31 of the insulating film 30, of the circuit board 300. On at least one of the barrier metal layers 520, of the semiconductor element 200 on the lower-layer side and the circuit board 300 of the semiconductor device 510, the bump 530 such as solder is provided, and the semiconductor element 200 on the lower layer side and the circuit board 300 are electrically connected to each other via the bump 530. The electronic device 500 is thus obtained.

Here, the solder exemplifies the bump 530 that establishes electrical connection between the upper and lower electronic components (between the semiconductor elements 200, between the semiconductor element 200 and the semiconductor element 100, and between the semiconductor element 200 and the circuit board 300). However, a columnar electrode such as a Cu pillar may be used as the bump 530. Such a columnar electrode may be formed on a terminal of each of the electronic components by using, for example, electroplating.

Further, the configuration (including the type of the included semiconductor element, the number of laminated layers, and the like) of the semiconductor device 510 is not limited to this example. A semiconductor element different from the semiconductor element 100 and the semiconductor element 200 may be included.

Furthermore, the type of the circuit board where the semiconductor device 510 is implemented is not limited to the circuit board 300 described above. The semiconductor device 510 may be implemented on a circuit board in any of various forms.

The electronic device 500 illustrated in FIG. 23 is an example of the electronic device including the structure where the electronic components are electrically connected to each other. Besides the connection described as examples in the electronic device 500, such as the connection between the semiconductor elements and the connection between the semiconductor element and the circuit board, connection between the circuit boards is also one of forms of the electrical connection between the electronic components. Further, there are also connection between the pseudo-SoCs, connection between the pseudo-SoC and the semiconductor element, and connection between the pseudo-SoC and the circuit board.

In the above description, the case where the uneven section is provided at the edge portion of the conductor pattern 70 (the wiring 20 and the land 40) coated with the insulating film 30 that is a surface layer of the electronic component is taken as an example. Such an uneven section is similarly applicable to the conductor pattern 70 of an inner layer, as well as the conductor pattern 70 coated with the insulating film 30.

Figure 24:
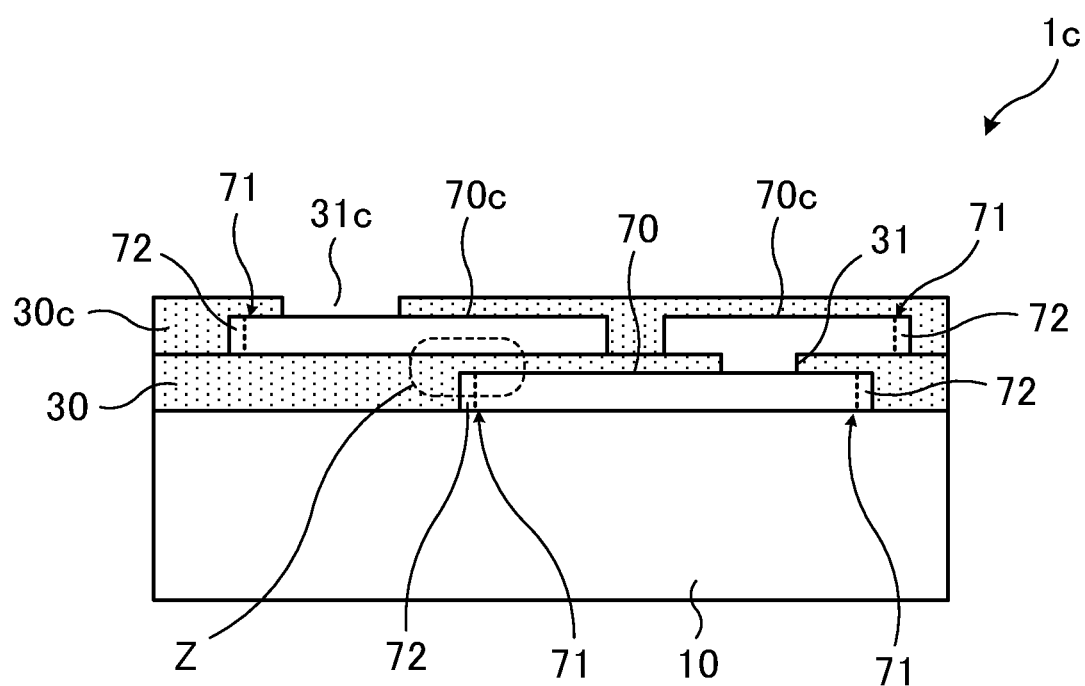
FIG. 24 is a diagram illustrating an example of an electronic component in which an uneven section is provided at a conductor pattern of an inner layer.

FIG. 24 is a diagram illustrating an example of an electronic component in which an uneven section is provided at a conductor pattern of an inner layer. Here, FIG. 24 is a main-part plane schematic diagram of the electronic component.

An electronic component 1c illustrated in FIG. 24 includes the substrate 10, the conductor pattern 70 provided on the substrate 10, and the insulating film 30 having the opening portion 31 communicating with the conductor pattern 70. The electronic component is further includes a conductor pattern 70c provided on the insulating film 30 and electrically connected to the conductor pattern 70, and an insulating film 30c having an opening portion 31c communicating with the conductor pattern 70c. The conductor pattern 70 and the conductor pattern 70c each include the wiring 20 and the land 40 described above.

After formation of the conductor pattern 70 on the substrate 10 and then formation of the insulating film 30 having the opening portion 31, the conductor pattern 70c is formed, and then the insulating film 30c having the opening portion 31c is formed, so that the electronic component 1c is formed.

In the electronic component 1c, the conductor pattern 70 in a lower layer is provided with an uneven section 72 (equivalent to the uneven sections 22 and 42 described above), and therefore, exposure of an edge portion 71 (equivalent to the edge portions 21 and 41 described above) of the conductor pattern 70 through the insulating film 30 is suppressed. Further, in the electronic component 1c, the conductor pattern 70c in an upper layer is similarly provided with the uneven section 72, and therefore, exposure of the edge portion 71 of the conductor pattern 70c through the insulating film 30c is suppressed.

In the electronic component 1c, since the exposure of the edge portion 71 of the conductor pattern 70 through the insulating film 30 is suppressed, contact with the conductor pattern 70c in the upper layer is suppressed in a region such as a region Z in FIG. 24.

In this way, the electronic component is suppressing a decline of reliability is achievable, also in the case of applying the uneven section 72 to the conductor pattern 70 in the inner layer.

Figure 25:
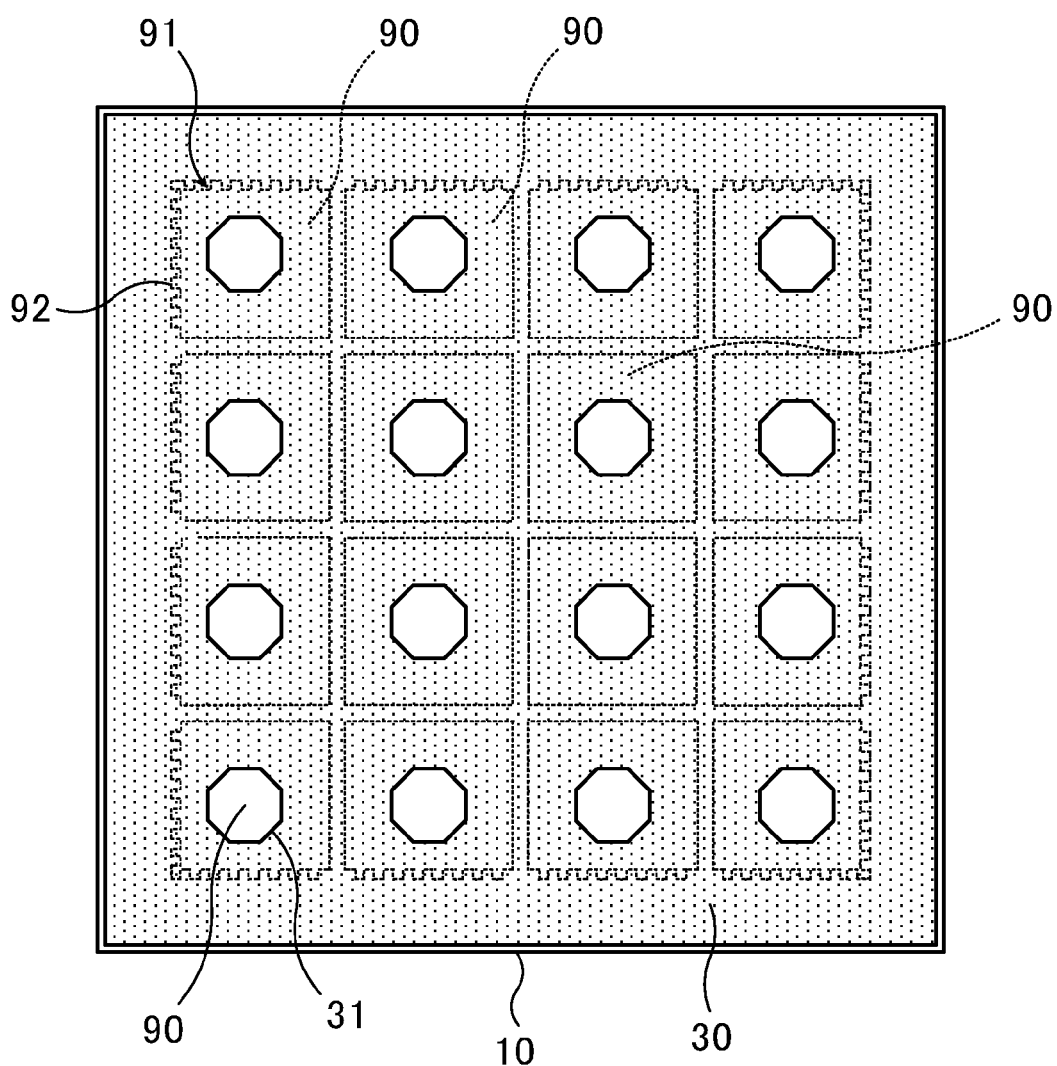
FIG. 25 is an explanatory diagram of a pad array.

The above-described technique of providing the uneven section at the edge portion of the conductor pattern is also applicable to pads disposed in an array as illustrated in FIG. 25.

FIG. 25 is an explanatory diagram of a pad array. Here, FIG. 25 is a main-part plane schematic diagram of an example of a state where a pad array is provided on a substrate. It is to be noted that the number of pads is not limited to the illustrated example.

As illustrated in FIG. 25, pads 90 are arranged in an array on the substrate 10, as a conductor pattern. On the substrate 10 where the pads 90 are thus arranged, the insulating film 30 having the opening portion 31 communicating with each of the pads 90 is provided.

For example, the pads 90 have edge portions 91, and an uneven section 92 may be provided at each of the edge portions 91 facing outward of a group of the pads 90 on the outermost periphery, while no uneven section 92 may be provided at the edge portions 91 facing each other of the adjacent pads 90, among the pads 90 arranged in the array. In this case, exposure of the edge portions 91 of the pads 90 through the insulating film 30 may be suppressed as well.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An electronic component comprising:
   a substrate;
   wiring pattern formed on a surface of the substrate, and including a first uneven section formed at an edge portion of the wiring pattern; and
   an insulating film formed on the substrate and on the wiring pattern.

2. The electronic component according to claim 1, further comprising:
   a first conductor formed on the surface of the substrate, and including a first portion in proximity to the wiring pattern,
   wherein the uneven section is formed at the edge portion of the wiring pattern except for a portion facing the first portion.

3. The electronic component according to claim 1, further comprising:
   a land formed on the surface of the substrate, connected to the wiring pattern, and including a second uneven section formed at an edge portion of the land.

4. The electronic component according to claim 3, wherein
   the insulating film includes an opening communicating with the land, and
   the insulating film is formed on the surface of the substrate and on the wiring pattern, as well as on the land except for a region corresponding to the opening.

5. The electronic component according to claim 3, further comprising:
   a second conductor formed on the surface of the substrate, and including a second portion in proximity to the land,
   wherein the land includes the second uneven section at the edge portion of the land except for a portion facing the second portion.

6. The electronic component according to claim 1, wherein the insulating film is a cured photosensitive resin.

7. The electronic component according to claim 1, wherein
   the substrate includes a semiconductor substrate,
   the semiconductor substrate includes an electrode passing through the semiconductor substrate from a front side to a back side thereof, and
   the wiring pattern is electrically connected to the electrode.

8. An electronic device comprising:
   a first electronic component including
   a substrate,
   wiring pattern formed on a surface of the substrate, and including a first uneven section formed at an edge portion of the wiring pattern,
   a land formed on the surface of the substrate, connected to the wiring pattern, and including a second uneven section formed at an edge portion of the land, and
   an insulating film formed on the surface of the substrate, on the wiring, and on the land, and including an opening communicating with the land; and
   a second electronic component disposed to face the insulating film of the first electronic component, and including a terminal electrically connected to the land at the opening portion.

* * * * *